(12) United States Patent
Lee et al.

(10) Patent No.: US 10,070,553 B2
(45) Date of Patent: Sep. 4, 2018

(54) CONNECTOR REPLACEMENT METHODS IN A NETWORK ELEMENT CHASSIS

(71) Applicant: Ciena Corporation, Hanover, MD (US)

(72) Inventors: Cindy Lee, Kanata (CA); Ryotaro Miyagawa, Kanata (CA); Trevor Meunier, Kempville (CA); Michael Reginald Bishop, Nepean (CA); Peter Saturley, Ottawa (CA)

(73) Assignee: Ciena Corporation, Hanover, MD (US)

( * ) Notice: Subject to any disclaimer, the term of this patent is extended or adjusted under 35 U.S.C. 154(b) by 231 days.

(21) Appl. No.: 15/052,392

(22) Filed: Feb. 24, 2016

(65) Prior Publication Data

US 2017/0244211 A1    Aug. 24, 2017

(51) Int. Cl.
*H01R 43/20* (2006.01)
*H05K 7/10* (2006.01)
*H05K 7/14* (2006.01)

(52) U.S. Cl.
CPC .................................. *H05K 7/1452* (2013.01)

(58) Field of Classification Search
CPC . H01R 43/22; H01R 43/205; Y10T 29/53283; H05K 7/1454; H04Q 1/15; H04Q 2201/12; H04M 3/12
See application file for complete search history.

(56) References Cited

U.S. PATENT DOCUMENTS

| | | | | |
|---|---|---|---|---|
| 3,696,492 A | * | 10/1972 | Baillard | H05K 7/1415 29/758 |
| 5,457,607 A | * | 10/1995 | Carvalho | H05K 7/1407 361/740 |
| 6,104,611 A | | 8/2000 | Glover et al. | |
| 6,144,561 A | * | 11/2000 | Cannella, Jr. | H05K 7/1447 361/788 |
| 6,158,111 A | * | 12/2000 | Doye | H01R 43/26 29/739 |
| 6,748,154 B2 | | 6/2004 | O'Leary et al. | |
| 6,880,239 B1 | | 4/2005 | Jennings et al. | |
| 6,910,267 B1 | | 6/2005 | Erwin | |
| 6,974,339 B2 | * | 12/2005 | Kuzmenka | H01R 43/0242 439/161 |
| 7,224,582 B1 | | 5/2007 | Saturley et al. | |
| 7,405,931 B2 | | 7/2008 | Saturley et al. | |
| 2011/0116233 A1 | * | 5/2011 | Beaudoin | H05K 7/20581 361/695 |
| 2017/0244211 A1 | * | 8/2017 | Lee | H05K 7/1452 |

* cited by examiner

*Primary Examiner* — Minh Trinh
(74) *Attorney, Agent, or Firm* — Clements Bernard Walker PLLC; Christopher L. Bernard; Lawrence A. Baratta, Jr.

(57) ABSTRACT

A connector replacement method in a network element chassis includes obtaining physical access to a backplane in the network element chassis, while the network element chassis is deployed; powering down backplane connectors for replacement while other backplane connectors remained powered; removing the powered down backplane connectors with a connector removal tool; inserting a new set of backplane connectors in place of the removed, powered down backplane connectors with a connector insertion tool; and powering up the new set of backplane connectors.

16 Claims, 28 Drawing Sheets

CONNECTOR REPLACEMENT METHODS IN A NETWORK ELEMENT CHASSIS

FIELD OF THE DISCLOSURE

The present disclosure generally relates to networking and computer hardware systems and methods. More particularly, the present disclosure relates to systems and methods for in-service connector replacement in a network element chassis.

BACKGROUND OF THE DISCLOSURE

Networking and computing hardware operates using a modular hardware structure where line cards, modules, blades, plug-ins, circuit packs, etc. (collectively "modules") are selectively inserted into a chassis for the desired functionality. This connectivity in the chassis may be through a backplane, midplane, etc. (collectively "backplane") with associated connectors. Conventionally, backplane connectors ("connectors") are factory installed and not field replaceable. As network element systems increase in performance, functionality, speed, power, etc., situations arise where connectors are damaged due to wear, vibration, corrosion, bending, and the like. One particular situation for damaged connectors arises as a result of vibration induced connector damage that was discovered on the cooling fan units and associated backplane connectors. Such damage is anticipated to become more prevalent as module power and consequently fan speeds and vibrations increase. Conventionally, a connector issue in the field requires a new backplane which effectively requires a new chassis. Thus, connector replacement in-service or even in-field is currently not possible. It would be advantageous to provide in-field and/or in-service connector replacement to address the aforementioned connector issues.

BRIEF SUMMARY OF THE DISCLOSURE

In an exemplary embodiment, a connector replacement method in a network element chassis includes obtaining physical access to a backplane in the network element chassis, while the network element chassis is deployed; powering down backplane connectors for replacement while other backplane connectors remained powered; removing the powered down backplane connectors with a connector removal tool; inserting a new set of backplane connectors in place of the removed, powered down backplane connectors with a connector insertion tool; and powering up the new set of backplane connectors. The connector replacement method can further include installing a backplane safety cover over the physical access for protection of the backplane and the other backplane connectors during operation on the backplane connectors for replacement. The backplane safety cover can include an open portion for selective access to the backplane and one or more doors for selective access to the backplane connectors.

The connector removal tool can include a housing, a handle, a vise configured to move based on rotation of the handle, a push out block configured to move based on movement of the vise, and a plurality of pins on the push out block arranged based on the backplane connectors for replacement and configured to push out the backplane connectors for replacement based on movement of the push out block. The connector insertion tool can include a housing, a handle, a vise configured to move based on rotation of the handle, a push in block configured to move based on movement of the vise, and a connector block on the housing opposing the push in block. The connector removal tool and the connector insertion tool can be configured to operate on the powered down backplane connectors on one of a top portion of the backplane and a bottom portion of the backplane. The backplane connectors for replacement can be fan connectors, and the method can further include installing an externally powered temporary fan unit subsequent to powering down the backplane connectors for replacement, enabling cooling during the method while the network element chassis is in-service. The backplane connectors for replacement can be fan connectors, and wherein temporary cooling can be performed in the network element chassis while the backplane connectors for replacement are powered down.

In another exemplary embodiment, a toolkit for replacing connectors in a network element chassis includes a connector removal tool adapted to remove a set of backplane connectors from a backplane in the network element chassis in-service; a connector insertion tool adapted to insert a new set of backplane connectors into the backplane; and a backplane safety cover adapted to protect areas of the backplane which are not being operated on by the connector removal tool and the connector insertion tool. The backplane safety cover can include an open portion for selective access to the backplane and one or more doors for selective access to the backplane connectors.

The connector removal tool can include a housing, a handle, a vise configured to move based on rotation of the handle, a push out block configured to move based on movement of the vise, and a plurality of pins on the push out block arranged based on the backplane connectors for replacement and configured to push out the backplane connectors for replacement based on movement of the push out block. The connector insertion tool can include a housing, a handle, a vise configured to move based on rotation of the handle, a push in block configured to move based on movement of the vise, and a connector block on the housing opposing the push in block. The connector removal tool and the connector insertion tool can be configured to operate on the powered down backplane connectors on one of a top portion of the backplane and a bottom portion of the backplane. The connector removal tool can include a cavity for collecting the powered down backplane connectors. The backplane connectors for replacement can be fan connectors, and the toolkit can further include an externally powered temporary fan unit installed subsequent to powering down the backplane connectors for replacement, to enable cooling while the network element chassis is in-service. The backplane connectors for replacement can be fan connectors, and wherein temporary cooling can be performed in the network element chassis while the backplane connectors for replacement are powered down.

In a further exemplary embodiment, a backplane fan unit connector replacement method in a network element chassis includes obtaining physical access to a backplane in the network element chassis, while the network element chassis is deployed; powering down backplane connectors for replacement while other backplane connectors remained powered; installing an externally powered temporary fan unit subsequent to powering down the backplane connectors for replacement, enabling cooling during the method while the network element chassis is in-service; removing the powered down backplane connectors with a connector removal tool; inserting a new set of backplane connectors in place of the removed, powered down backplane connectors with a connector insertion tool; and powering up the new set of backplane connectors. The backplane fan unit connector replacement method can further include installing a backplane safety cover over the physical access for protection of the backplane and the other backplane connectors during operation on the backplane connectors for replacement.

The connector removal tool can include a housing, a handle, a vise configured to move based on rotation of the handle, a push out block configured to move based on movement of the vise, and a plurality of pins on the push out block arranged based on the backplane connectors for replacement and configured to push out the backplane connectors for replacement based on movement of the push out block. The connector insertion tool can include a housing, a handle, a vise configured to move based on rotation of the handle, a push in block configured to move based on movement of the vise, and a connector block on the housing opposing the push in block.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various exemplary embodiments, the present disclosure relates to systems and methods for in-service connector replacement in a network element chassis. The systems and methods include tools and an associated methodology to replace damaged backplane connectors in the field and in-service. As described herein, in the field means the hardware (i.e., system, chassis, etc.) has been shipped to the end user and in-service means the system is in the field and also operational. In an exemplary, embodiment, the systems and methods include replacing damaged backplane connectors used for powering cooling fan units while the chassis is operating. Through in-service performance, traffic on the chassis is unaffected. The various exemplary embodiments are described herein with reference to removal and insertion of connectors associated with cooling fan units, but those of ordinary skill in the art will recognize the systems and methods are contemplated with any connectors in-service. In an exemplary embodiment, the in-service replacement of connectors associated with cooling fans includes a temporary fan unit that provides cooling during the replacement procedure while the cooling fans are removed. Advantageously, the systems and methods allow the chassis to maintain live traffic while connector replacement is performed.

In various exemplary embodiments, the systems and methods utilize various mechanical tools and jigs such as a connector removal tool 10, a connector insertion tool 12, a backplane safety cover 14, and a temporary fan unit 16. The connector removal tool 10 is a jig which removes damaged connectors in-service, the connector insertion tool 12 inserts new connectors in-service, the backplane safety cover 14 can be placed over the remaining portion of a backplane which is not being worked on, and the temporary fan unit 16 is utilized in the specific embodiment associated with replacing cooling fan connectors. Each of the aforementioned tools and jigs is described as follows.

Connector Removal Tool

Figure 1:
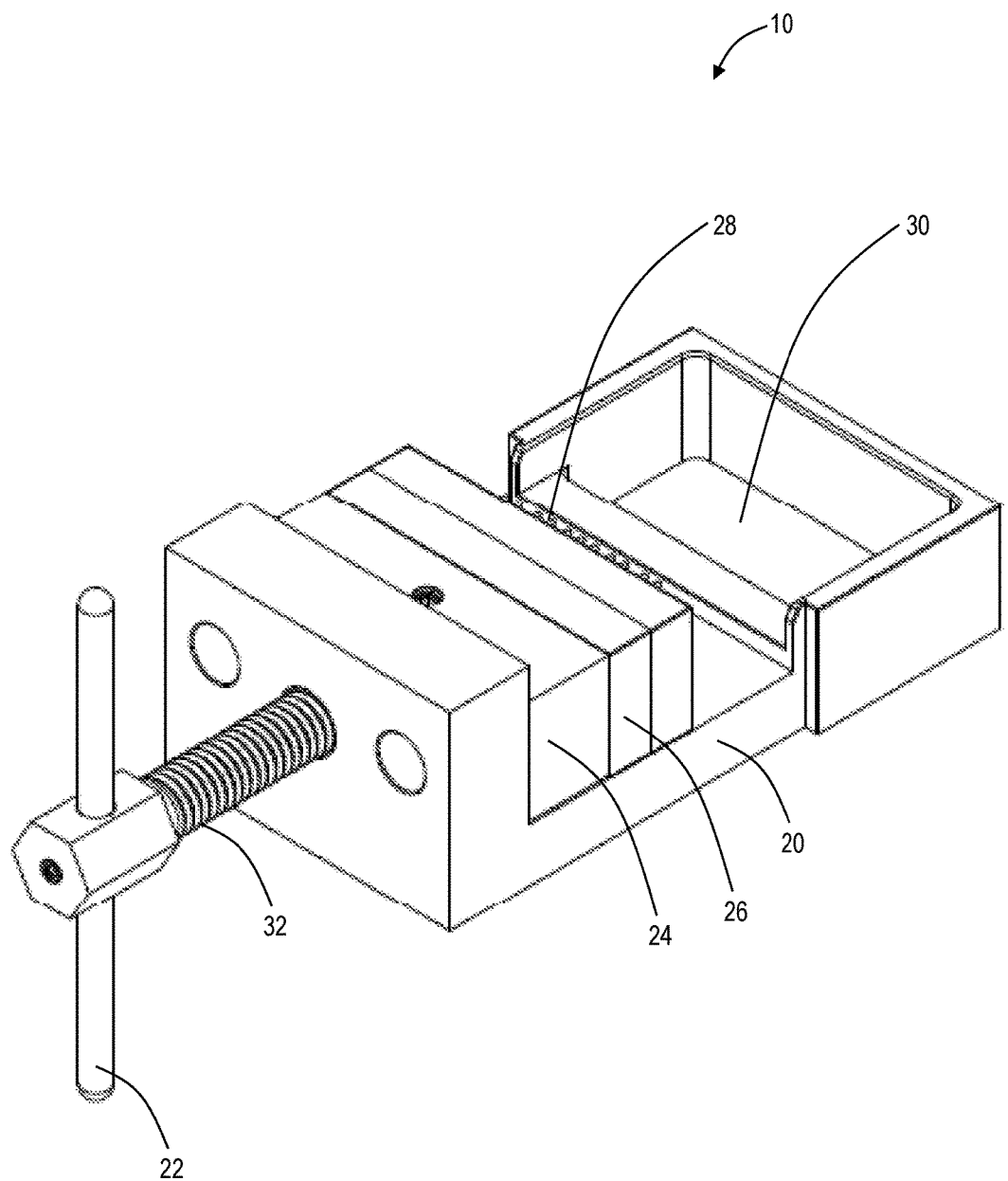
FIG. 1 is a perspective view of the connector removal tool for removing backplane connectors.
Figure 2:
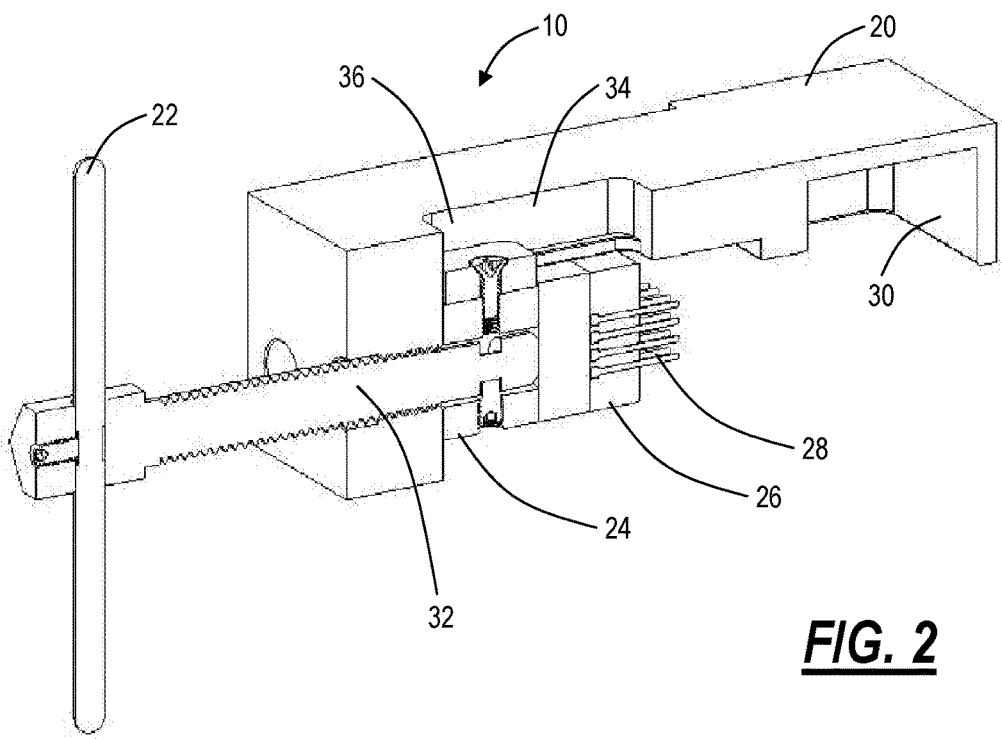
FIG. 2 is a cross-sectional view of the connector removal tool of FIG. 1.
Figure 3:
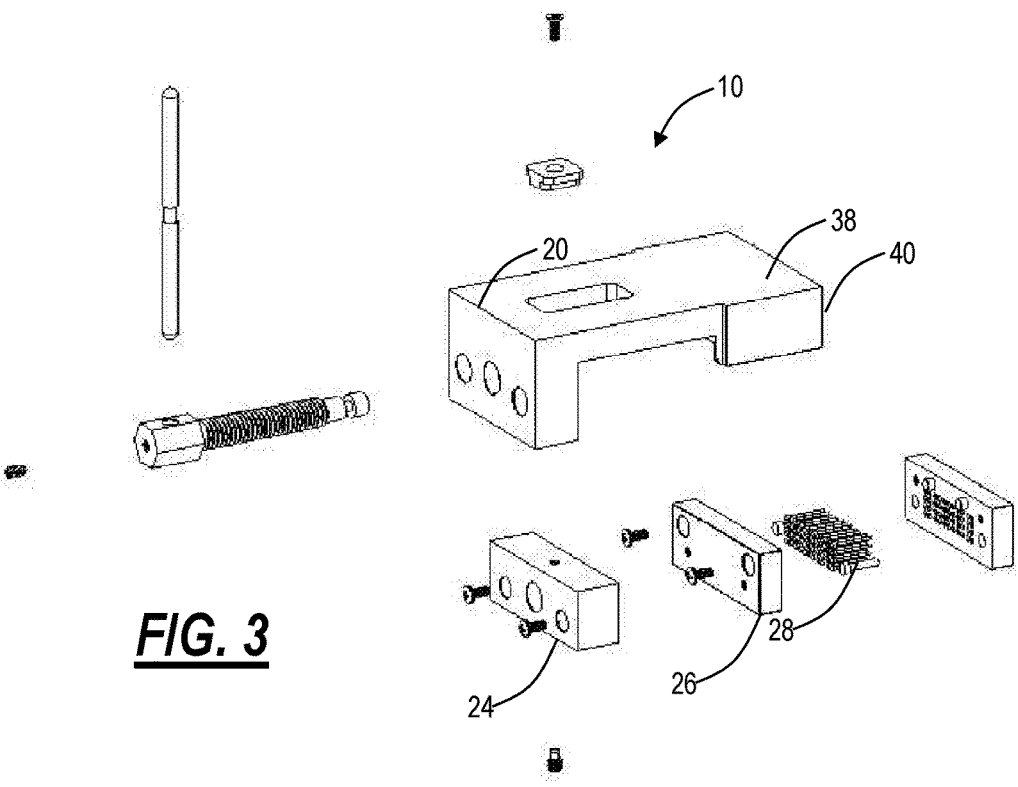
FIG. 3 is an exploded part view of the connector removal tool of FIG. 1.

Referring to FIGS. 1-3, in an exemplary embodiment, various diagrams illustrate a connector removal tool 10 for removing backplane connectors. Specifically, FIG. 1 is a perspective view of the connector removal tool 10, FIG. 2 is a cross-sectional view of the connector removal tool 10, and FIG. 3 is an exploded part view of the connector removal tool 10. The connector removal tool 10 is configured to operate on the top, bottom, or sides of a Printed Circuit Board (PCB), backplane, etc. to remove backplane connectors. The connector removal tool 10 includes a housing 20, a rotatable handle 22, a vise 24, and a sliding pin push out block 26 with a plurality of pins 28. The plurality of pins 28 is arranged as required for pushing out corresponding pins in a backplane, Printed Circuit Board (PCB), etc. The housing 20 can include a cavity 30 where the removed connectors are collected.

In FIG. 1, the connector removal tool 10 is arranged to remove pins from a lower portion of the backplane. In an alternate embodiment, the connector removal tool 10 can be arranged to remove connectors on an upper portion of the backplane, with the cavity 30 flipped. Note that to remove connectors from an upper portion of the backplane, the connector removal tool 10 has to be reoriented (used upside down). Operationally, the handle 22 is rotated to turn a screw 32 which translates force to the vise 24 which in turns exerts a force on the sliding pin push out block 26 which in turn exerts a force on the pins 28 which push out corresponding connectors into the cavity 30.

In FIG. 2, a cross-section of the connector removal tool 10 shows the vise 24 is coupled to a sliding block 34 which is slidingly connected to the housing 20 in a channel 36. The sliding pin push out block 26 is also selectively insertable in the vise 24. Particularly, the pins 28 are arranged as required, and different push out blocks 26 can have different pin arrangements as required such that the connector removal tool 10 can support different connector arrangements.

In FIG. 3, the exploded part view shows connectivity between the vise 24, the push out block 26, and the housing 20. Also, the cavity 30 can be formed by plates 38, 40 which slidingly engage the housing 20 for supporting the cavity 30 to capture the connectors in either an upper or lower portion arrangement, i.e., whether the connector removal tool 10 is used from a bottom or top of the backplane. Also, the plates 38, 40 can be transparent allowing a camera to see through the plates 38, 40 during operation. Alternatively, when the cavity 30 is upside down, use temporary fan unit 16 to capture removed connectors instead.

Figure 4:
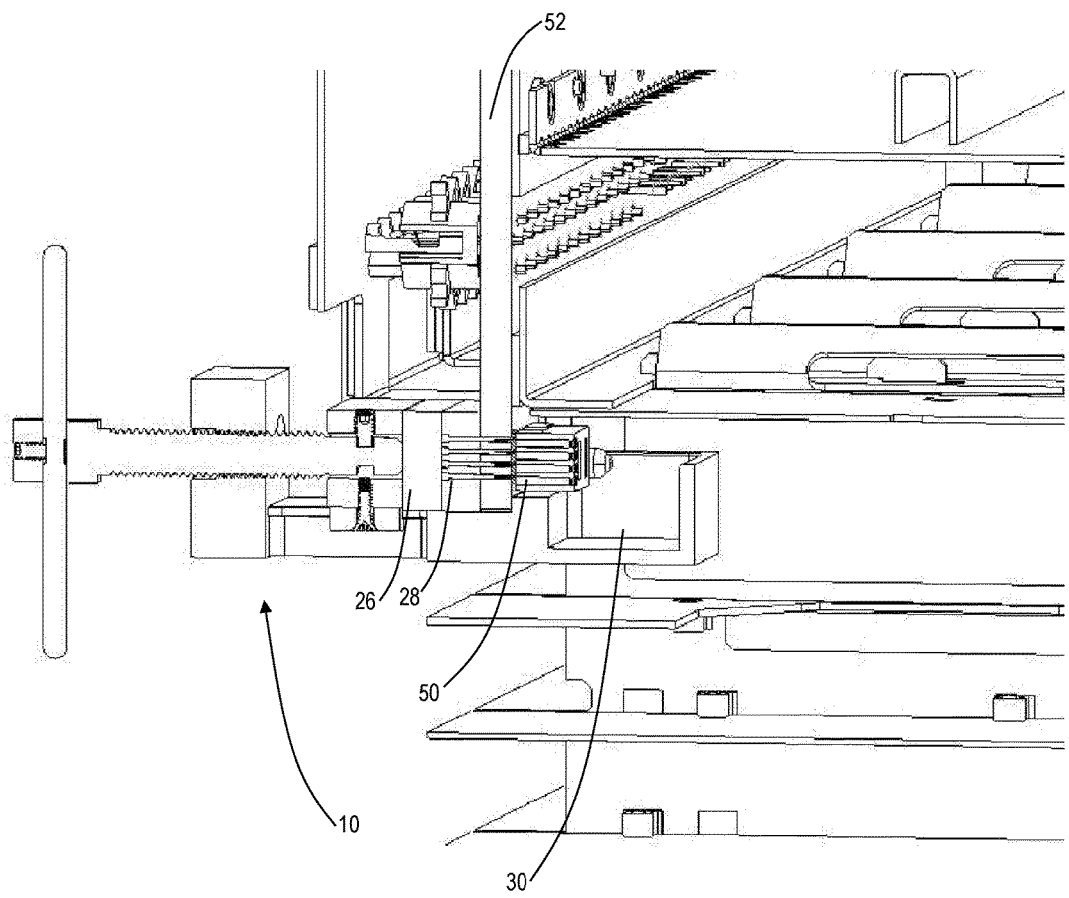
FIG. 4 is a perspective diagram of use of the connector removal tool of FIG. 1 to remove a connector block from a bottom portion of a backplane.
Figure 5:
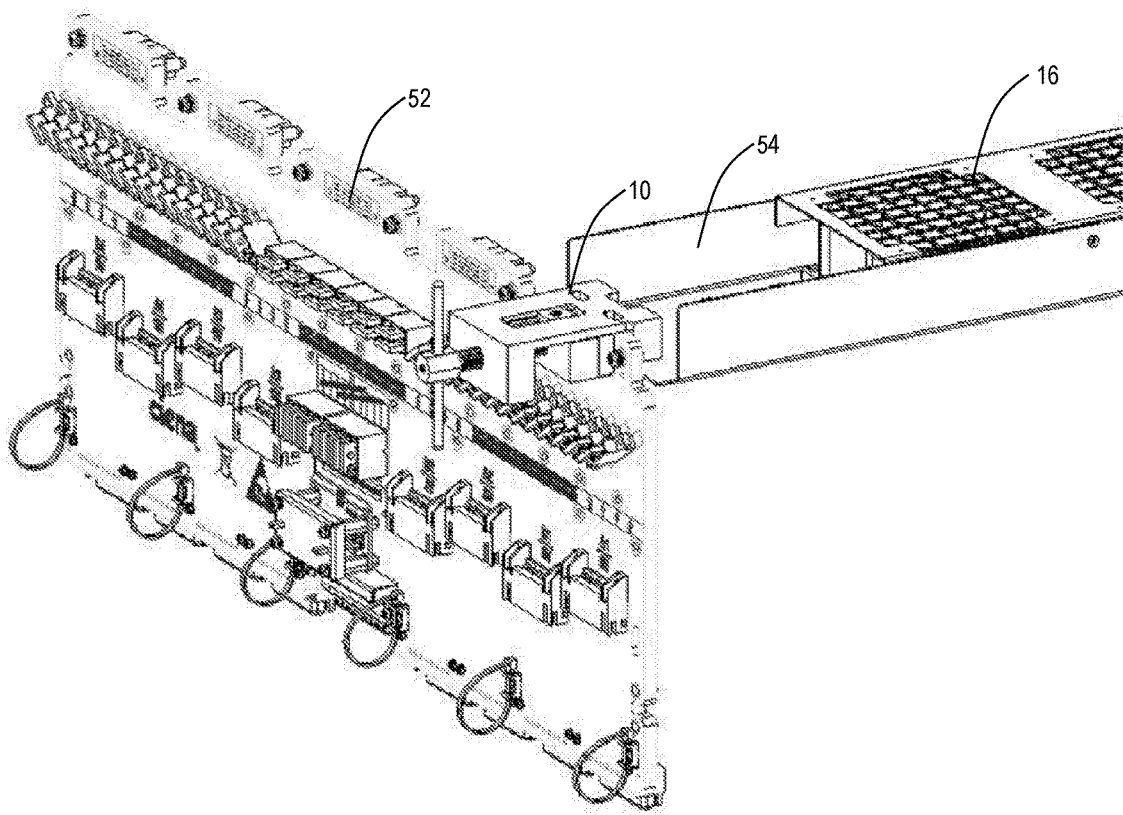
FIG. 5 is a perspective diagram of use of the connector removal tool of FIG. 1 to remove a connector block from a top portion of the backplane.

Referring to FIGS. 4 and 5, in exemplary embodiments, perspective diagrams illustrate the use of the connector removal tool 10 to remove connectors 50 from a bottom portion of a backplane 52 (FIG. 4) and from a top portion of the backplane 52 (FIG. 5). In FIG. 4, the connectors 50 are captured in the cavity 30. In FIG. 5, the connectors 50 are captured in a catch basin 54 in the temporary fan unit 16.

Connector Insertion Tool

Figure 6:
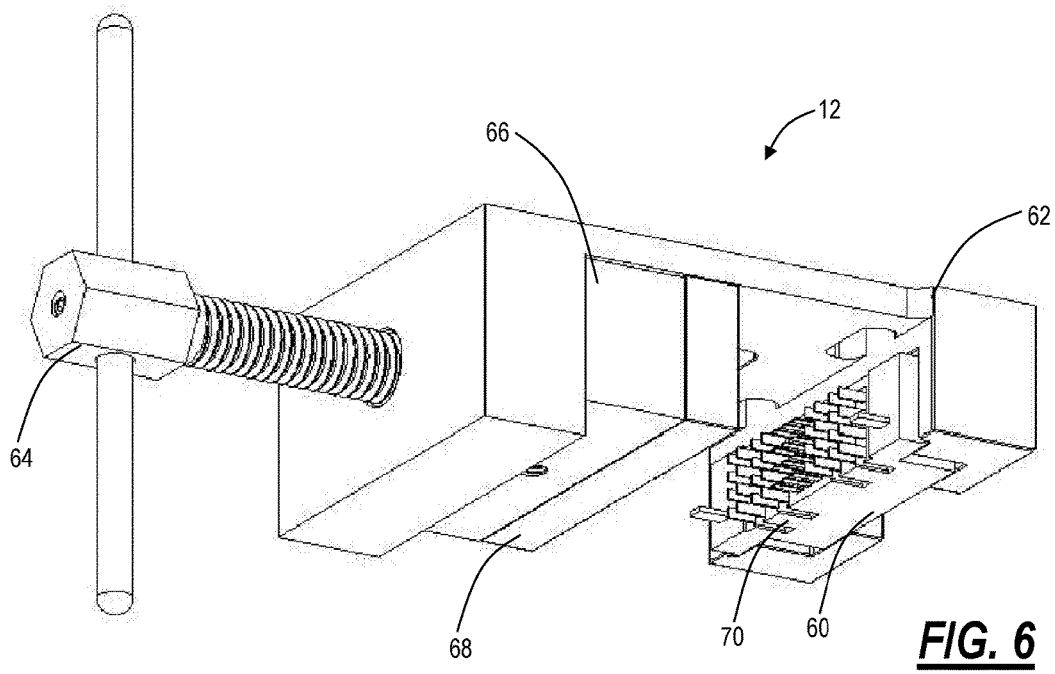
FIG. 6 is a perspective view of the connector insertion tool for inserting backplane connectors.
Figure 7:
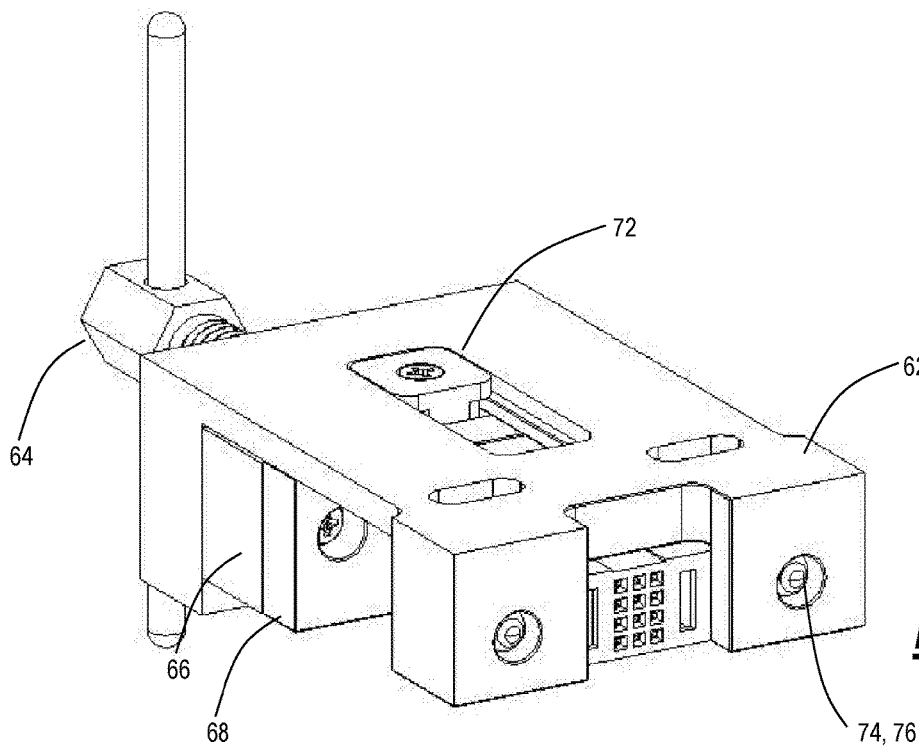
FIG. 7 is a perspective view of another side of the connector insertion tool of FIG. 6.
Figure 8:
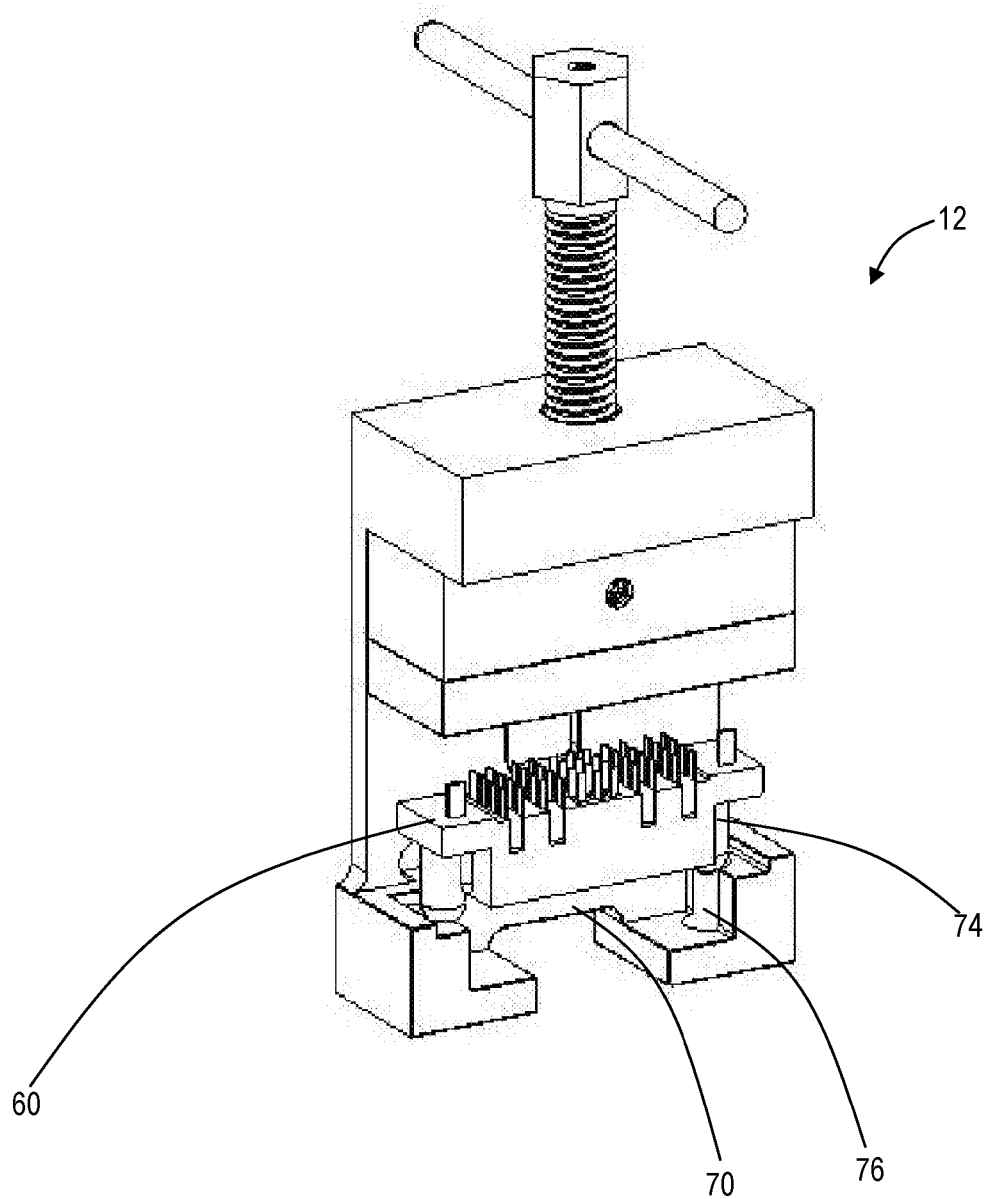
FIG. 8 is a close-up of a connector block which is inserted using the connector insertion tool of FIG. 6.

Referring to FIGS. 6-8, various diagrams illustrate a connector insertion tool 12 for inserting backplane connectors. Specifically, FIG. 6 is a perspective view of the connector insertion tool 12, FIG. 7 is a perspective view of another side of the connector insertion tool 12, and FIG. 8 is a close-up of a connector block 60 which is inserted using the connector insertion tool 12. The connector insertion tool 12 is similar to the connector removal tool 10, providing the opposite functionality. The connector insertion tool 12 is configured to operate on the top, bottom, or sides of a Printed Circuit Board (PCB), backplane, etc. to insert the connector block 60. In FIG. 6, the connector insertion tool 12 includes a housing 62, a rotatable handle 64, a vise 66, and a sliding push in block 68, and a cavity 70 in the housing 62 for holding the connector block 60.

FIG. 7 shows a sliding block 72 that holds the vise 66 and the push in block 68 to the housing 62. The connector block 60 can be held in the cavity 70 by inserts 74 which engage holes 76 in the housing 62. FIG. 8 shows the connector block 60 inserted into the cavity 70, with the inserts 74 engaging the holes 76. Again, the connector insertion tool 12 can support different types of connector blocks 60 with varying pin arrangements.

Figure 9:
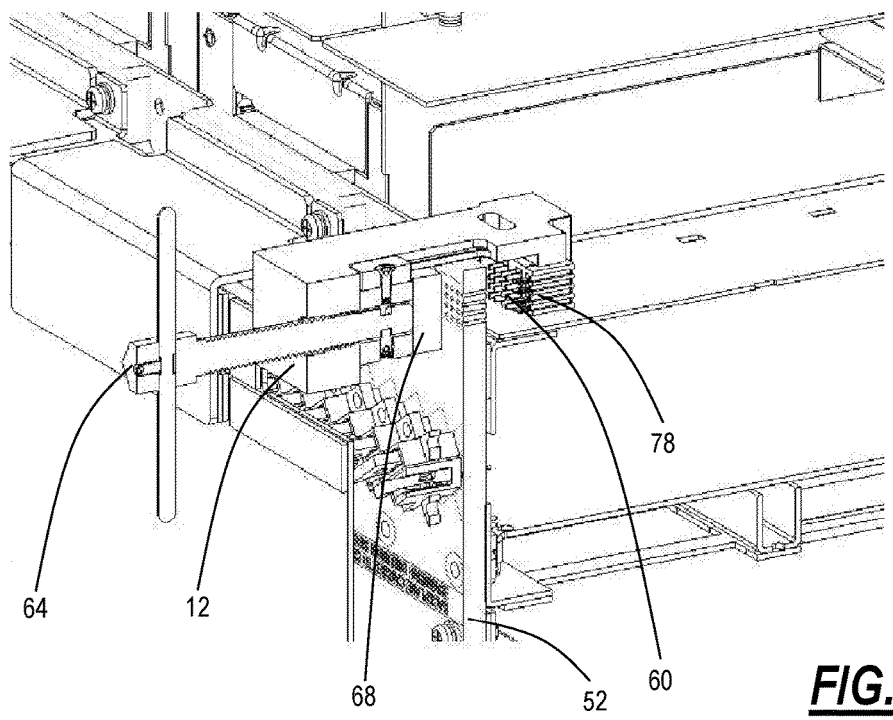
FIGS. 9 and 10 are perspective diagrams of use of the connector insertion tool of FIG. 6 to insert the connector block in the backplane.
Figure 10:
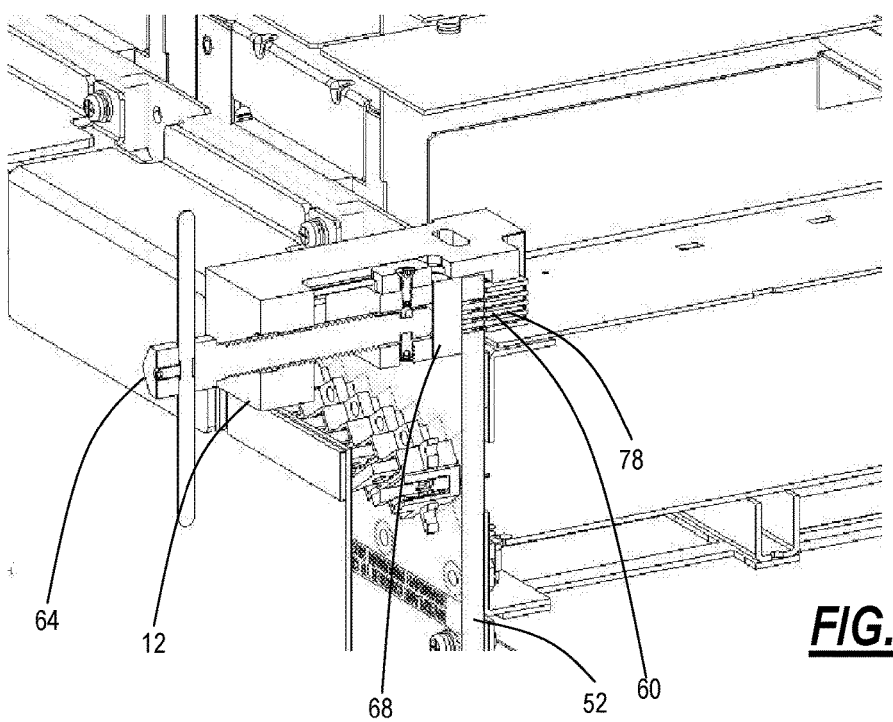

Referring to FIGS. 9 and 10, in an exemplary embodiment, perspective diagrams illustrate the use of the connector insertion tool 12 to insert the connector block 60 in the backplane 52. In FIG. 9, the connector insertion tool 12 aligns to holes 78 (vias) in the backplane 52. In FIG. 10, the handle 64 is rotated to push the push in block 68 forward via the vise 66 to engage the connector block 60 in the holes 78.

Backplane Safety Cover

Figure 11:
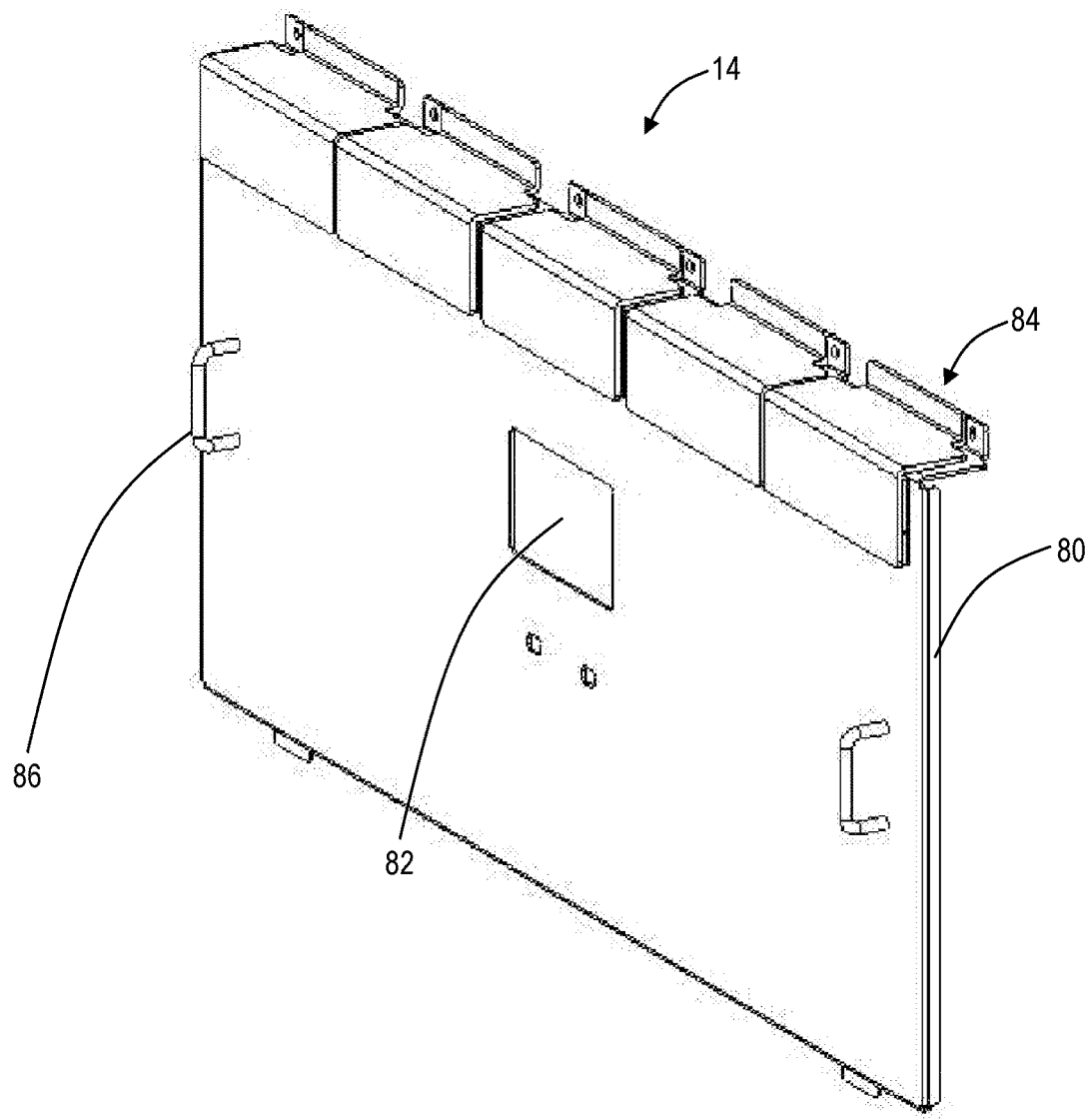
FIG. 11 is a perspective diagram of a backplane safety cover, for protecting the backplane and protecting operators while using the connector removal tool of FIG. 1 and the connector insertion tool of FIG. 6.

Referring to FIG. 11, in an exemplary embodiment, a perspective diagram illustrates a backplane safety cover 14, for protecting the backplane 52 while using the connector removal tool 10 and the connector insertion tool 12. Again, the tools 10, 12 contemplate operation in-service on the backplane 52 to remove damaged connectors and insert the connector block 60. Accordingly, the backplane safety cover 14 provides protection to the backplane 52 for areas not being addressed. In this example, the backplane 52 has connectors at the top. Accordingly, the backplane safety cover 14 includes a covered portion 80, an open portion 82, and various cover doors 84 that can open and close to provide access to specific portions of the backplane 52 for operation thereon. Further, the backplane safety cover 14 can include handles 86 as well. Note, the open portion 82 is an opening to provide access to fuses.

Temporary Fan Unit

Figure 12:
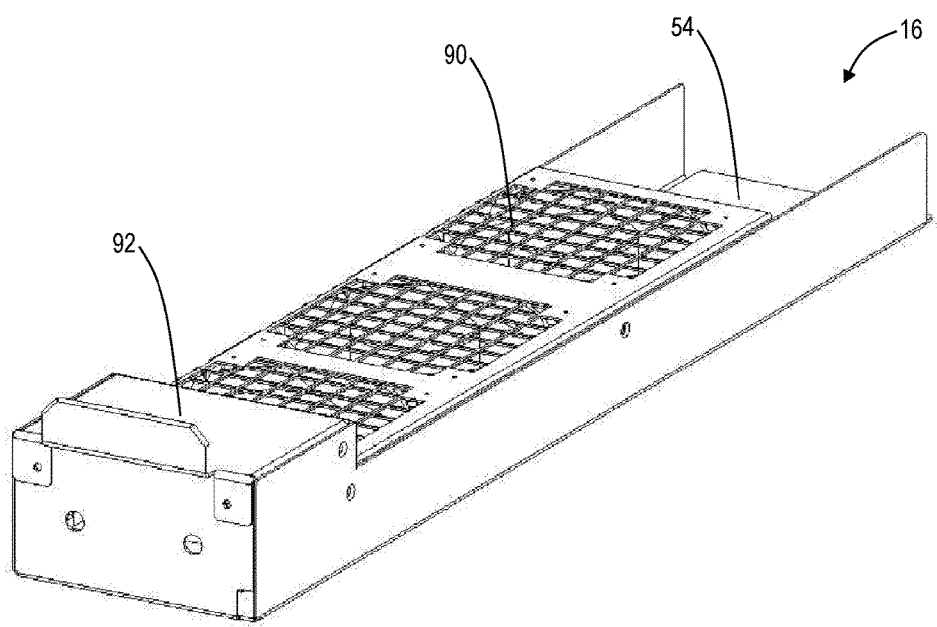
FIG. 12 is a perspective diagram of a temporary fan unit, for providing cooling while connectors are replaced, in-service.

Referring to FIG. 12, in an exemplary embodiment, a perspective diagram illustrates a temporary fan unit 16, for providing cooling while fan connectors are replaced, in-service. In an exemplary embodiment, the connector removal tool 10 and the connector insertion tool 12 and the backplane safety cover 14 are used to replace damaged backplane connectors used for powering fan units while the chassis (or shelf) is kept live (in-service). By keeping the chassis (or shelf) live, any traffic that is being routed through it is unaffected. Accordingly, it is important to protect physically the backplane 52 during the procedure to remove and replace connectors, such as via the backplane safety cover 14. Also, when removing a fan unit, it is important to continue to provide cooling while the procedure is performed. Accordingly, the temporary fan unit 16 can be used in place of the fan unit while the procedure is performed.

The temporary fan unit 16 includes cooling fans 90 in a housing 92. The housing 92 is dimensioned to fit into a slot for the fan unit. However, the temporary fan unit 16 does not plug into the backplane 52. Instead, the temporary fan unit 16 uses external power, such as from a power supply, power cable, etc. A rear portion of the housing 92 includes the catch basin 54 for capturing the connectors as well as open space for performing the procedure.

Fan Connector Replacement Process

Figure 13:
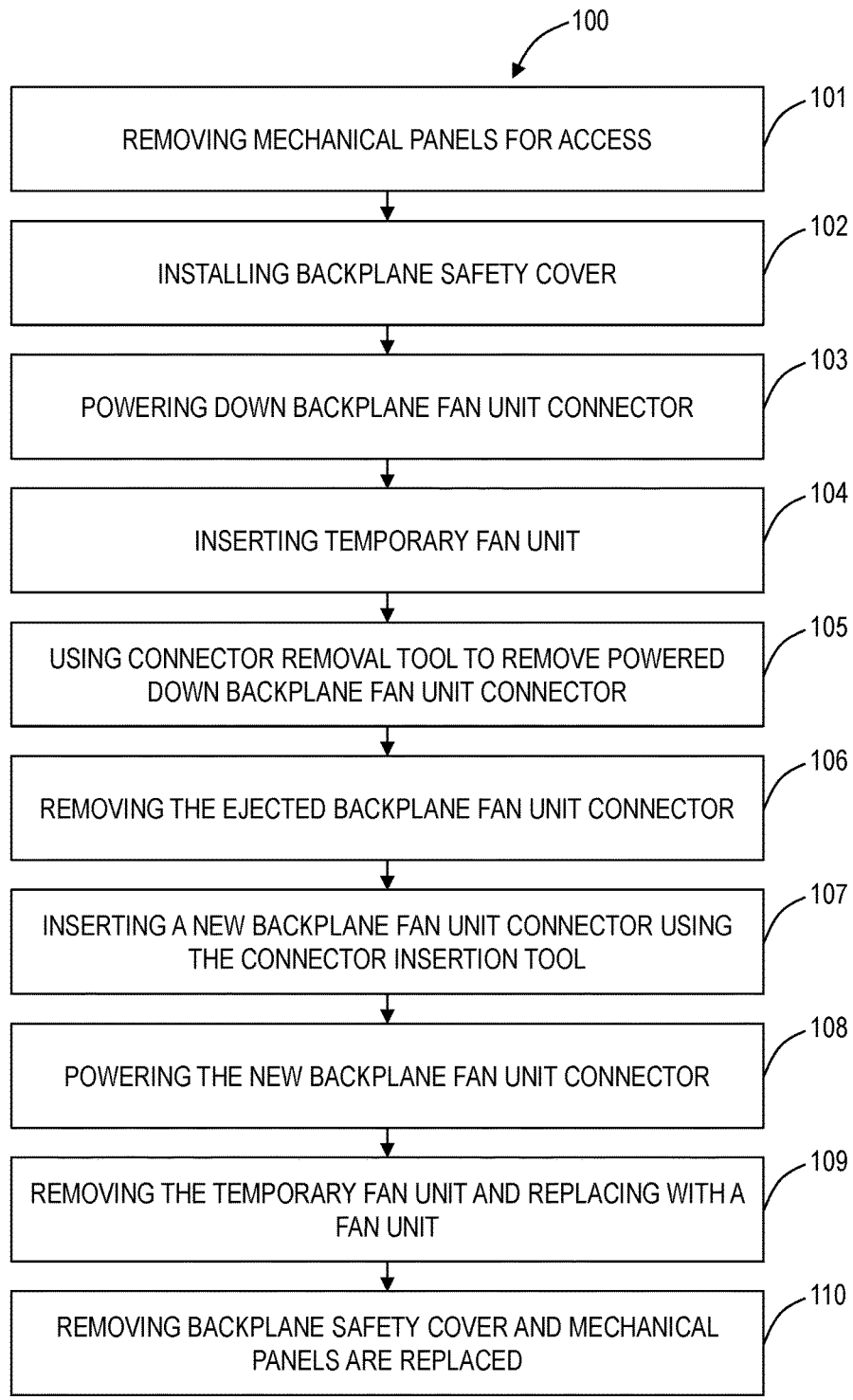
FIG. 13 is a flowchart of a connector replacement process, utilizing the connector removal tool of FIG. 1, the connector insertion tool of FIG. 6, the backplane safety cover of FIG. 11, and the temporary fan unit of FIG. 12.

Referring to FIG. 13, in an exemplary embodiment, a flowchart illustrates a connector replacement process 100, utilizing the connector removal tool 10, the connector insertion tool 12, the backplane safety cover 14, and the temporary fan unit 16. The connector replacement process 100 includes removing mechanical panels for access (step 101). For example, mechanical panels are removed to provide access to relevant fuses and to provide access to fan backplane connectors. The connector replacement process 100 includes installing the backplane safety cover 14 overtop of non-relevant electrical components to protect operators (step 102). The connector replacement process 100 includes powering down the backplane fan unit connector where the connector is being replaced (while keeping all other equipment operational) (step 103). Here, this can include removing a fuse associated with the backplane fan unit connector.

Next, the connector replacement process 100 includes inserting the temporary fan unit 16, to provide cooling to live circuit packs (step 104). The temporary fan unit 16 is externally powered and does not obscure access to backplane fan unit connector to be replaced. The connector replacement process 100 includes using the connector removal tool 10 to remove the powered down, backplane fan unit connector (step 105). This procedure accesses the backplane fan unit connector from the rear, but depending upon mechanical constraints, this could also be performed from the front of the backplane, as well as from either a top portion or a bottom portion of the backplane.

The connector replacement process 100 includes removing the ejected fan backplane fan unit connector (step 106). Again, the temporary fan unit 16 or the connector removal tool 10 has a trough to collect the ejected backplane fan unit connector. The connector replacement process 100 includes inserting a new backplane fan unit connector using the connector insertion tool 12 (step 107). The connector replacement process 100 includes powering the new backplane fan unit connector (step 108), such as, for example, replacing the fuse. The connector replacement process 100 includes removing the temporary fan unit 16 and replacing it with a fan unit that plugs into the new backplane fan unit connector (step 109). Finally, the backplane safety cover 14 is removed and mechanical panels are replaced (step 110), and the connector replacement process 100 is complete.

An exemplary operation of the connector replacement process 100 is now described on an exemplary chassis 200 in FIGS. 14-31.

Figure 14:
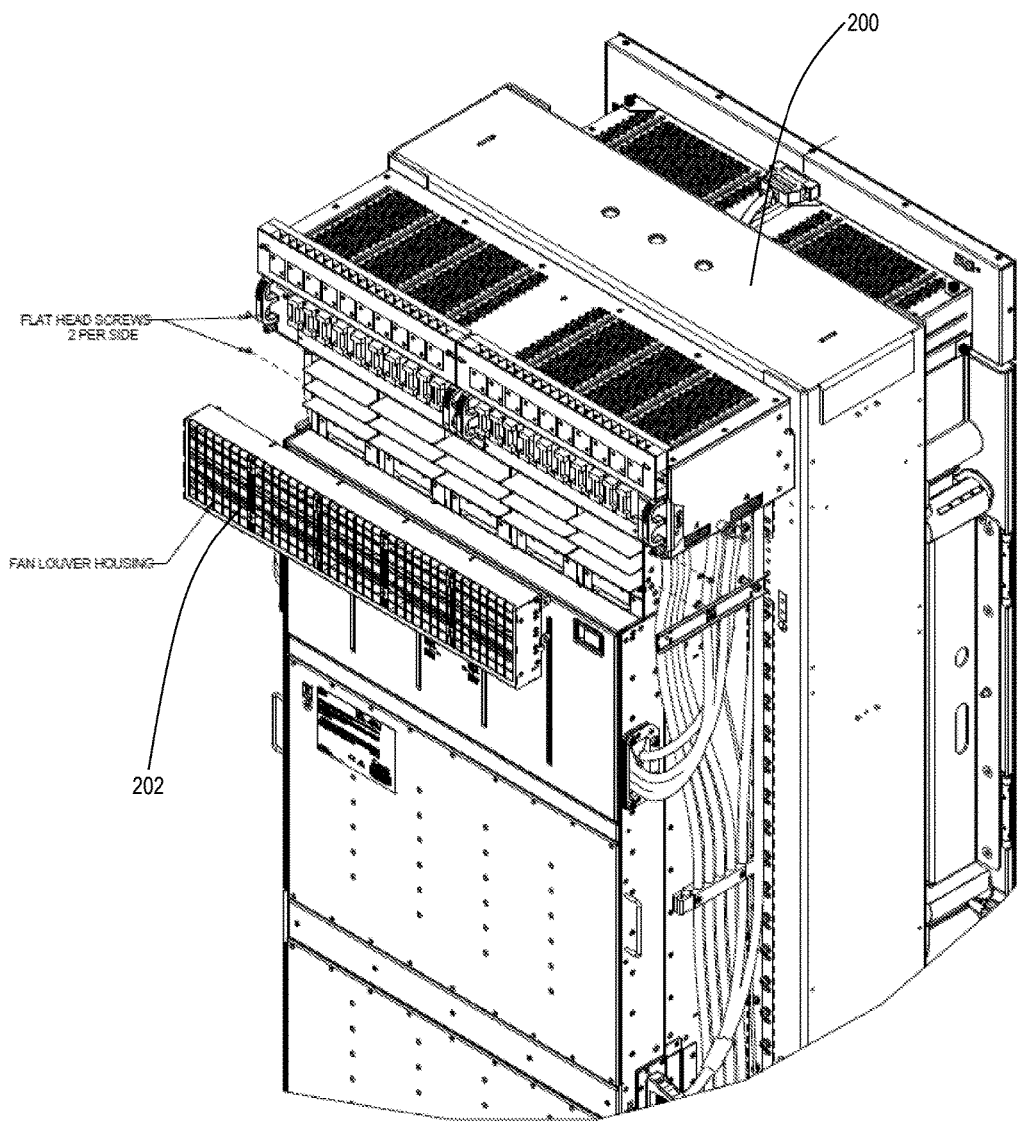
FIGS. 14-31 are perspective diagrams of an exemplary operation of the fan connector replacement process of FIG. 13 on an exemplary chassis.
Figure 15:
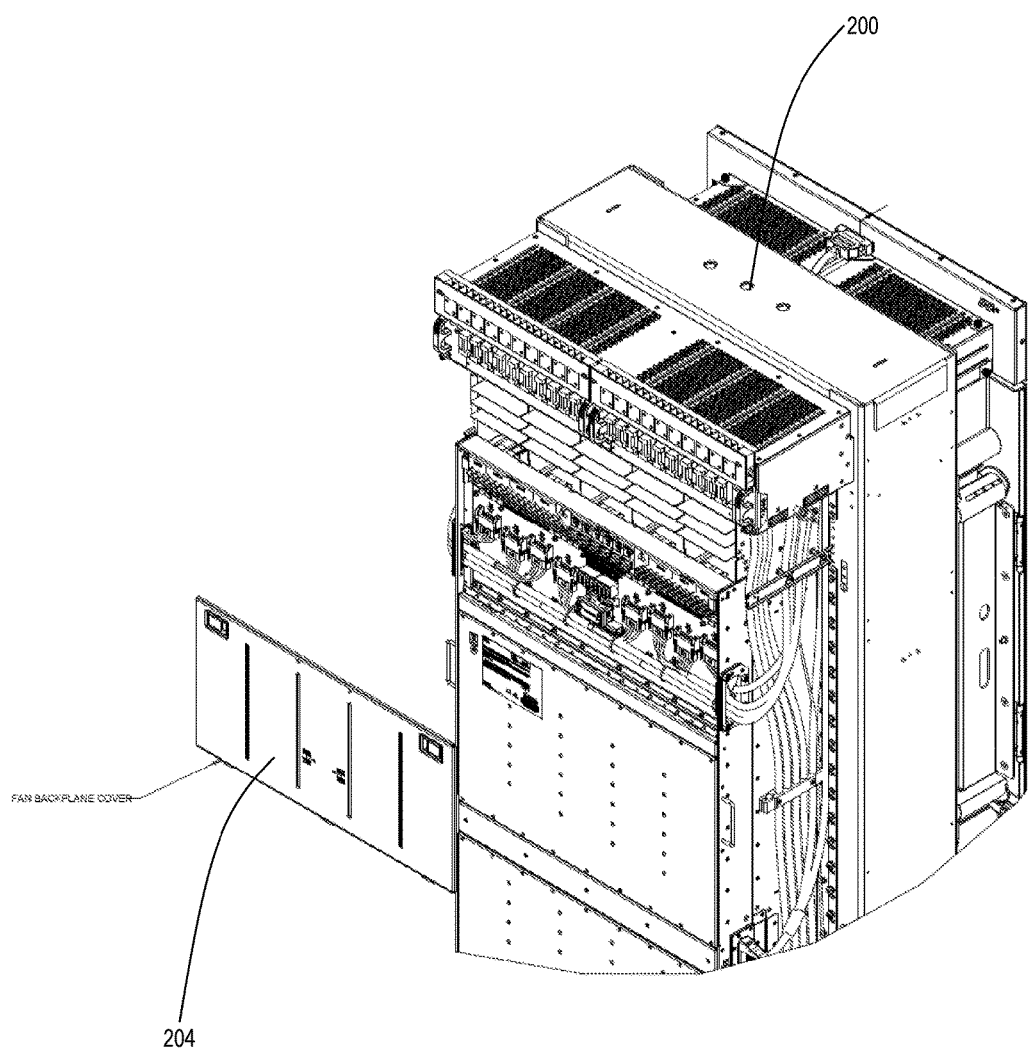
Figure 16:
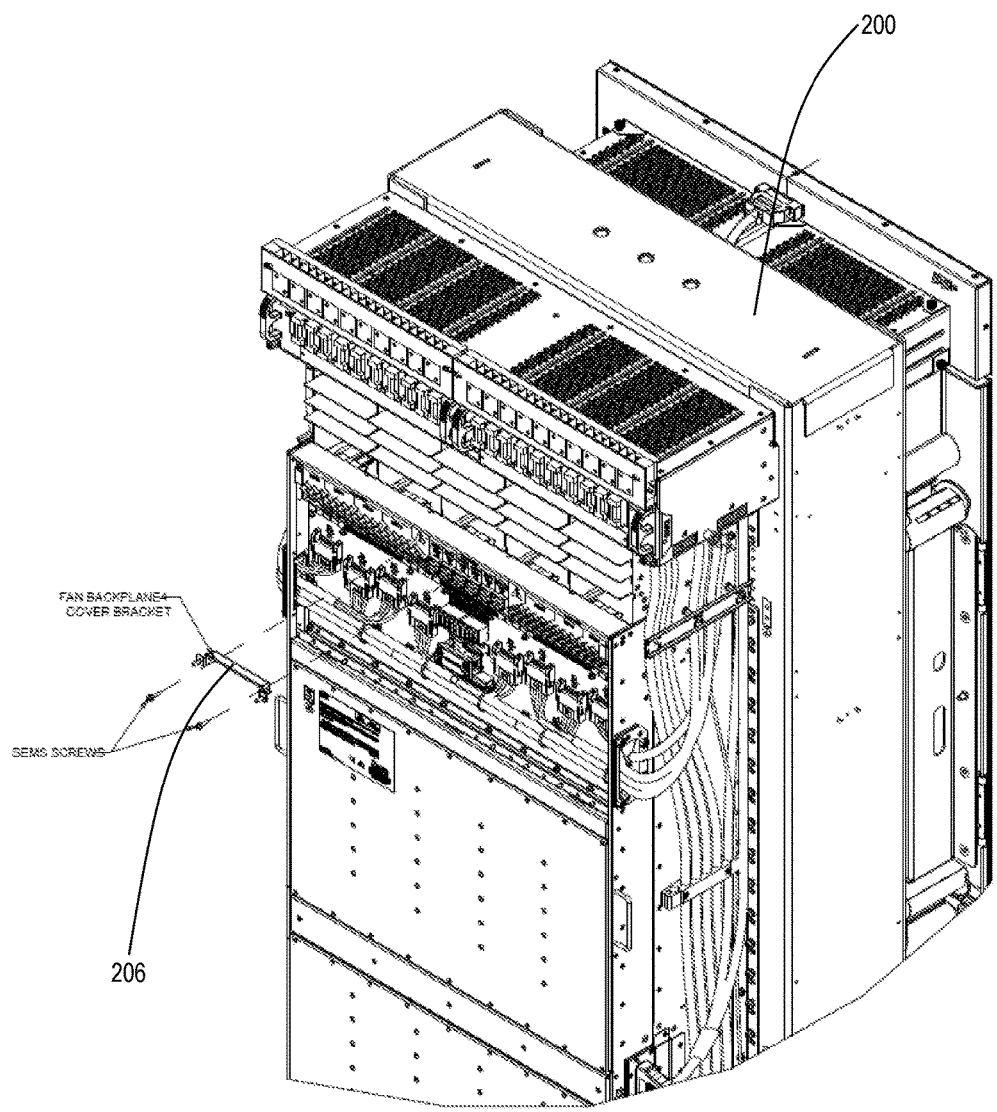
Figure 17:
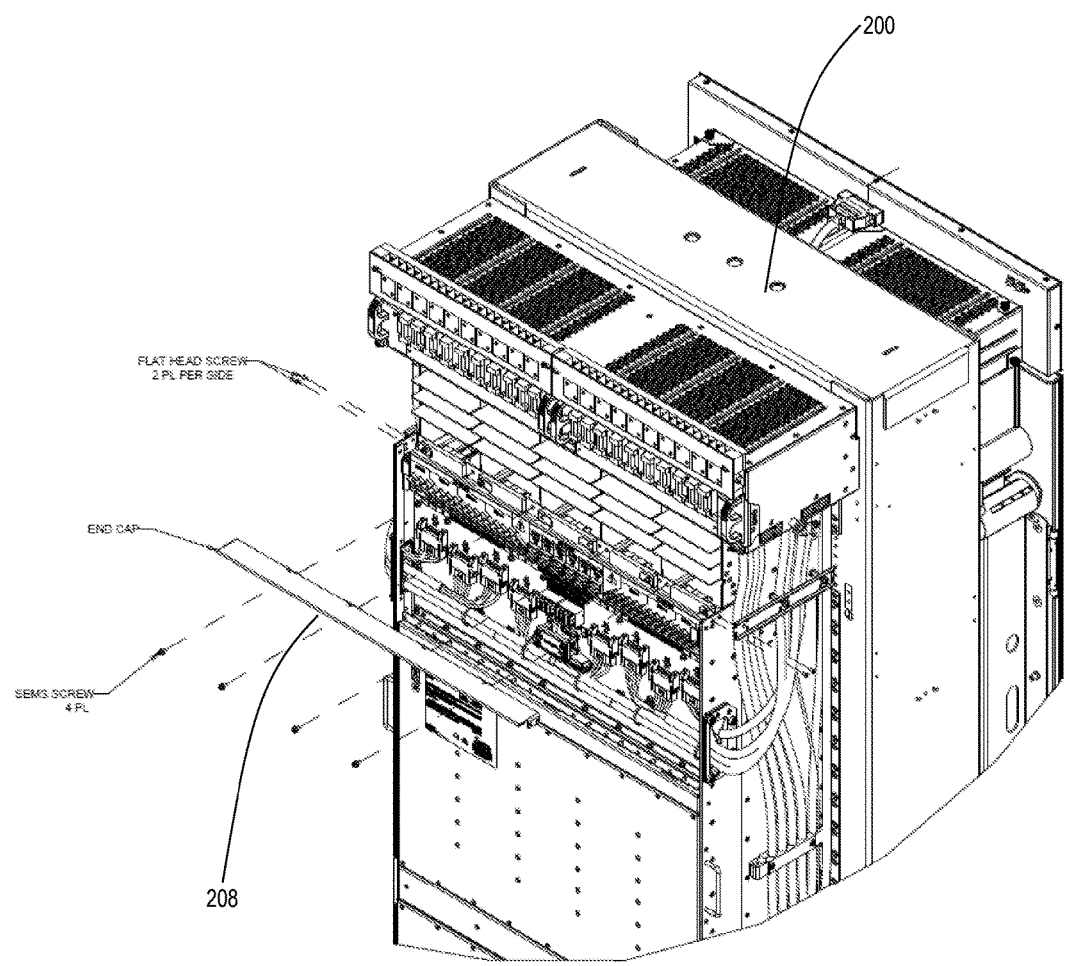
Figure 18:
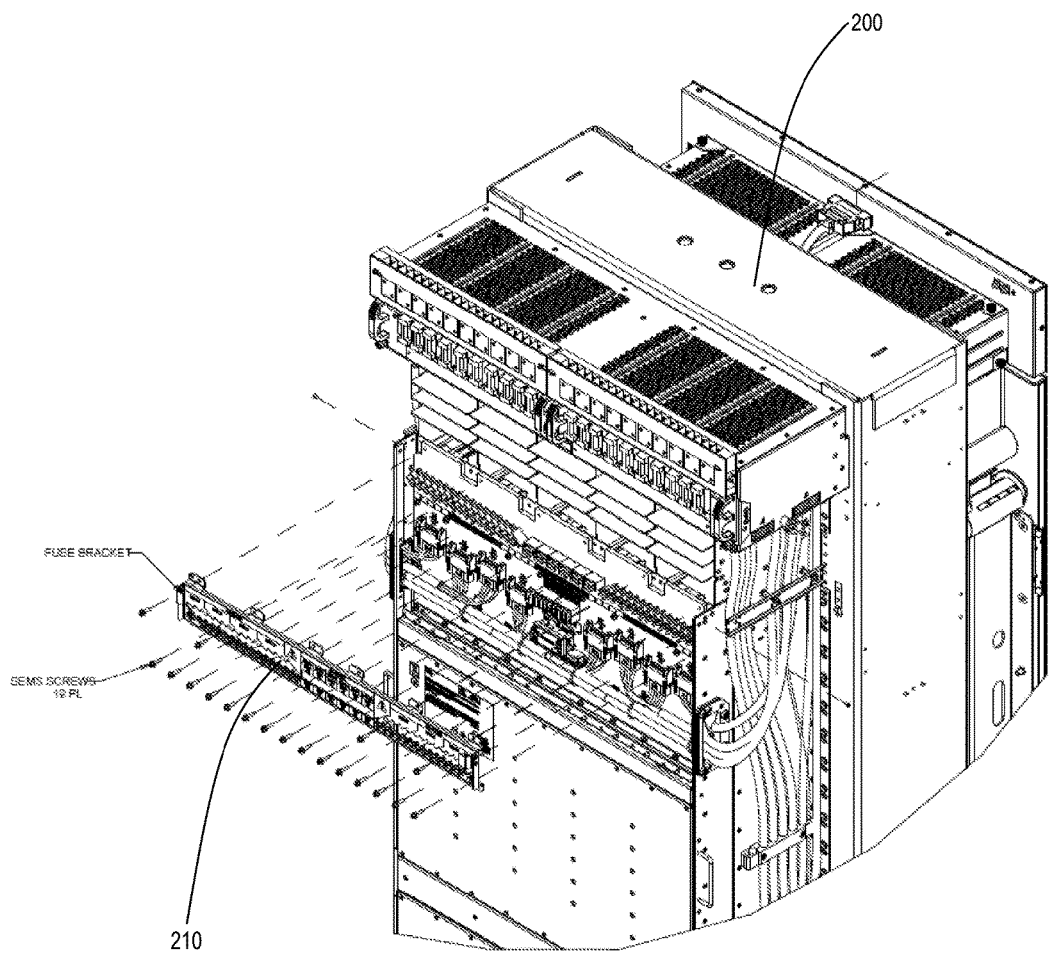

FIGS. 14-18 illustrate exemplary steps associated with step 101, removing mechanical panels for access. FIG. 14 illustrates removing a fan louver housing 202 by removing screws. FIG. 15 illustrates removing a fan backplane cover 204. FIG. 16 illustrates removing a backplane cover bracket 206. FIG. 17 illustrates removing an end cap 208. FIG. 18 illustrates removing a fuse bracket 210.

Figure 19:
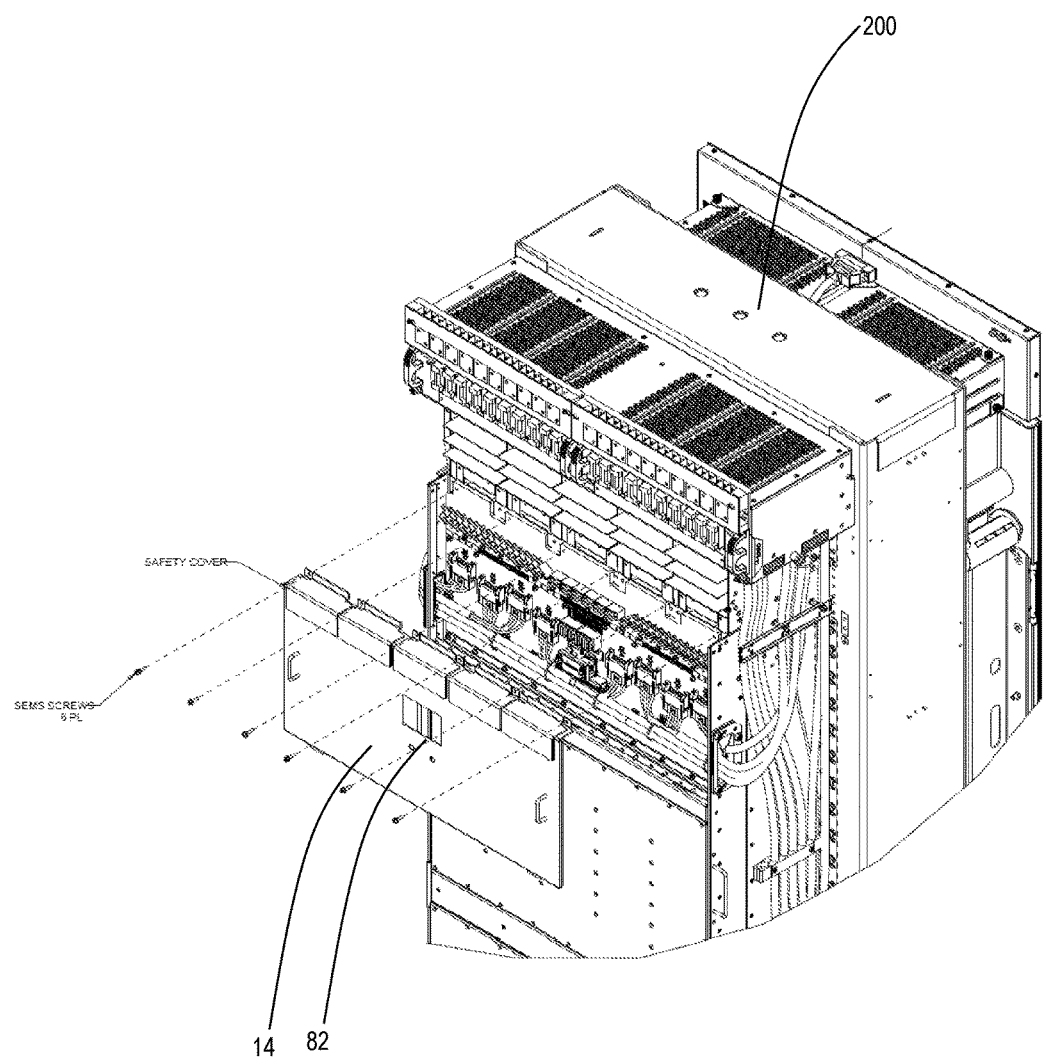

FIG. 19 illustrates step 102, installing the backplane safety cover 14. Note, the backplane safety cover 14 can be screwed into the chassis 200. The open portion 82 can provide access to fuses in the chassis 200.

Figure 20:
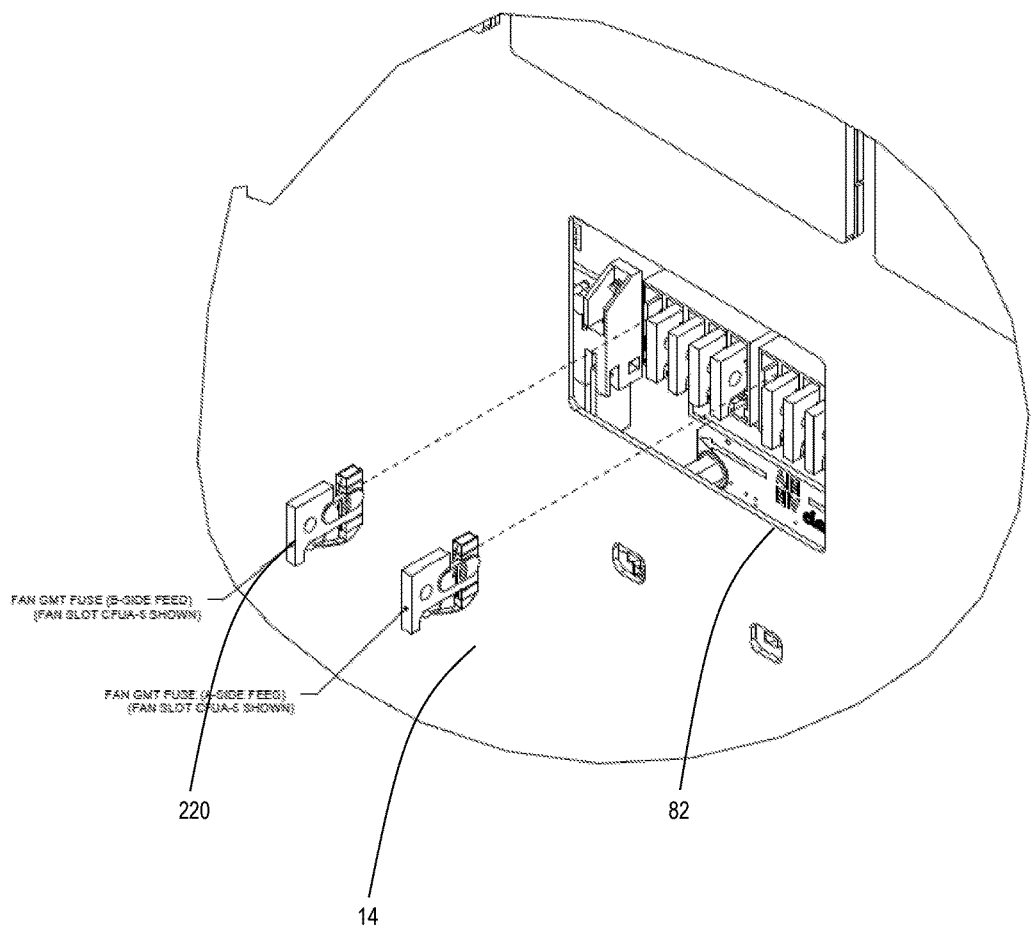

FIG. 20 illustrates step 103, powering down the backplane fan unit connector. Specifically, the open portion 82 provides access to fuses 220. The appropriate fuses 220 are removed to power down the backplane fan unit connector.

Figure 21:
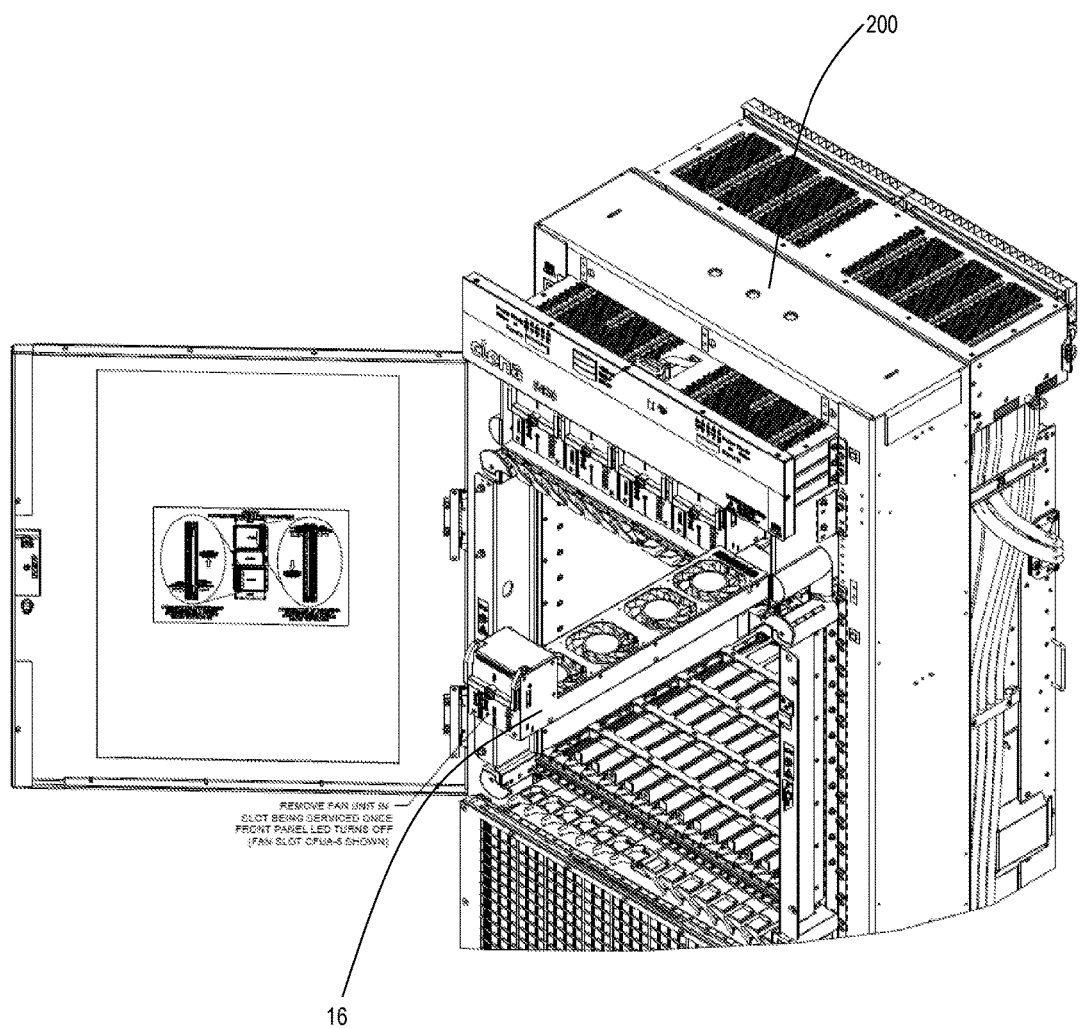

FIG. 21 illustrates step 104, inserting the temporary fan unit 16. Here, the temporary fan unit 16 is inserted on the front side of the chassis, in the fan unit slot associated with the backplane fan unit connector being operated on. The temporary fan unit 16 needs to be installed and powered on relatively soon after step 103 to ensure there is no overheating during the connector replacement process 100, while the chassis 200 is operational.

Figure 22:
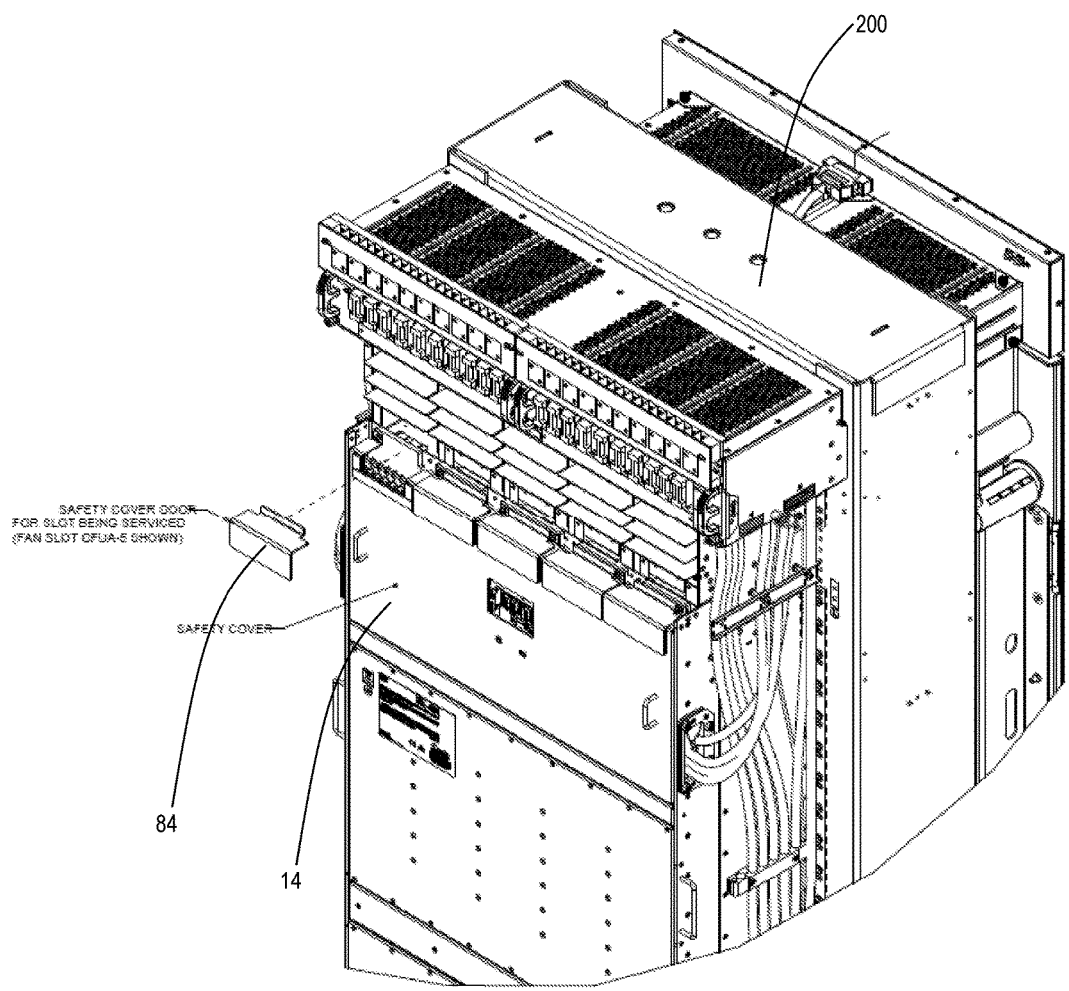
Figure 23:
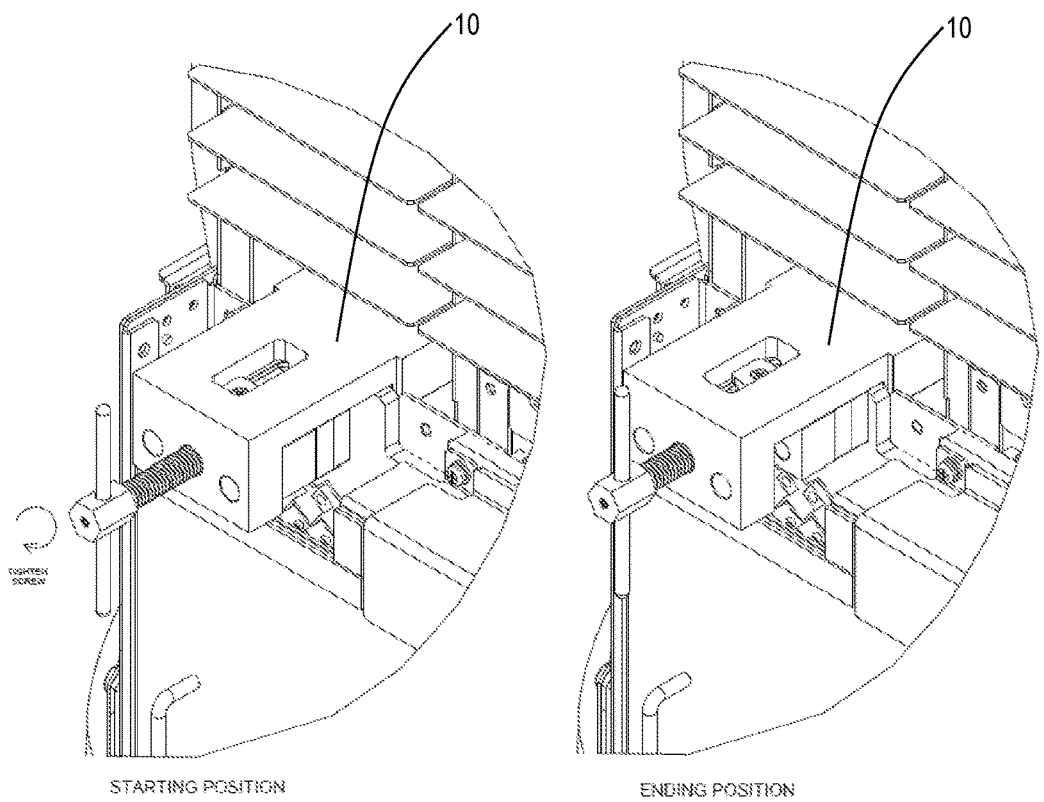
Figure 24:
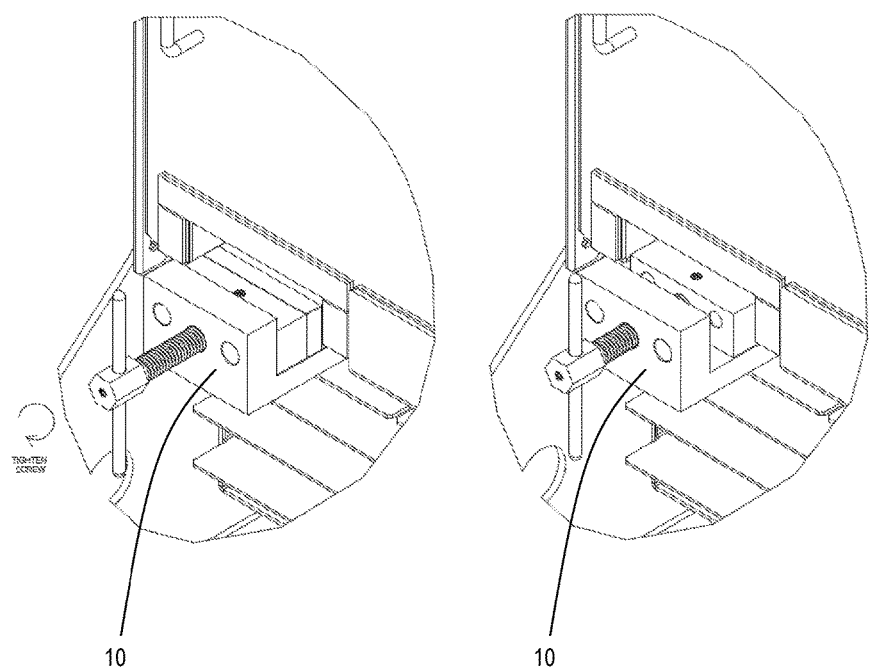

FIG. 22 illustrates removing the cover door 84 where the backplane fan unit connector being operated on is. FIGS. 23 and 24 illustrate step 105, using the connector removal tool 10 to remove the powered down backplane fan unit connector. Specifically, FIG. 23 illustrates using the connector removal tool 10 on the top of the chassis 200, and FIG. 24 illustrates using the connector removal tool 10 on the bottom of the chassis 200.

Figure 25:
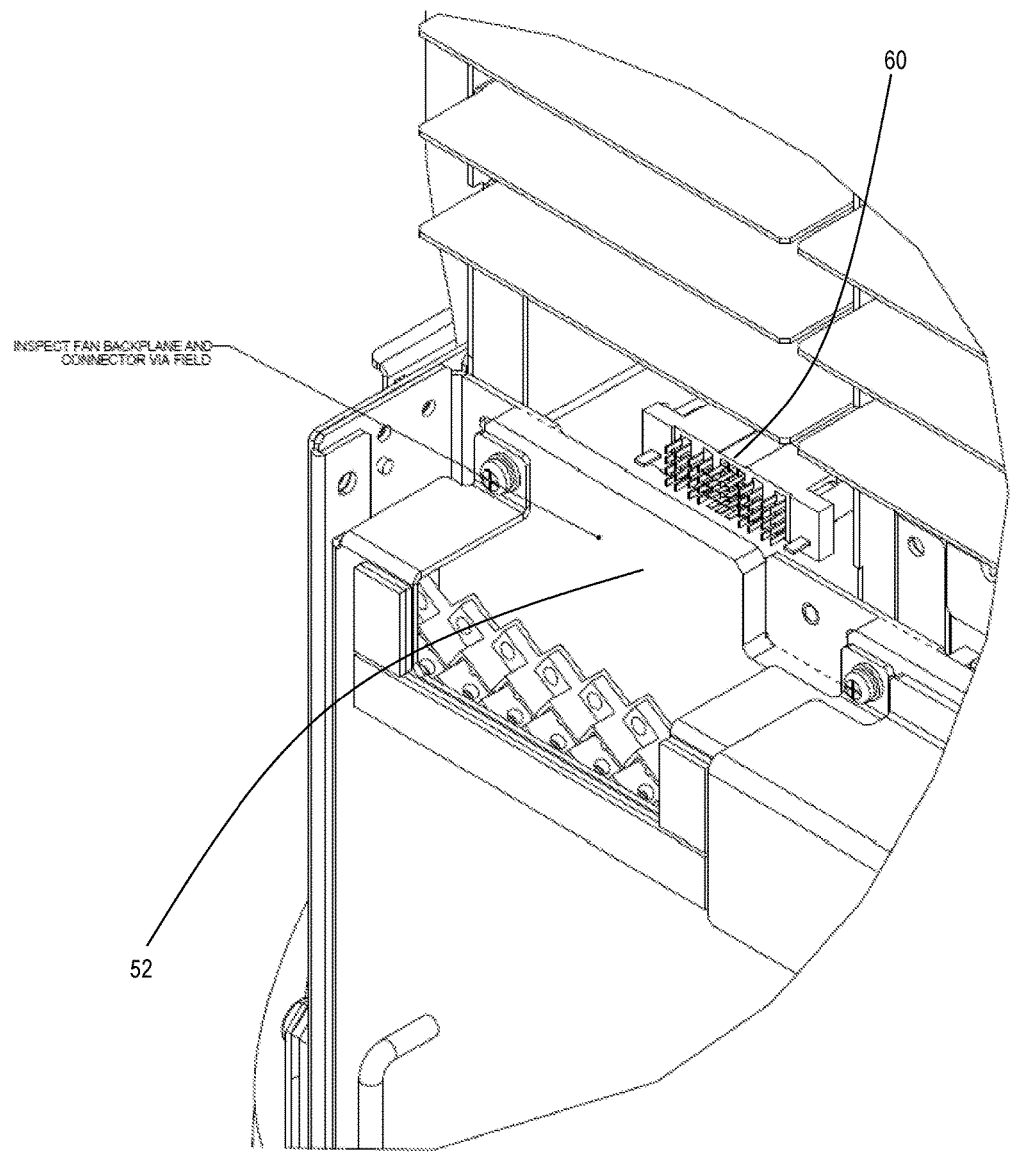

FIG. 25 illustrates the backplane 52 after the removal of the backplane connector block 60. The backplane 52 and connector vias can be inspected for signs of damage as a result of the connector removal process. Also, the ejected backplane connector block 60 can be removed, as in step 106.

Figure 26:
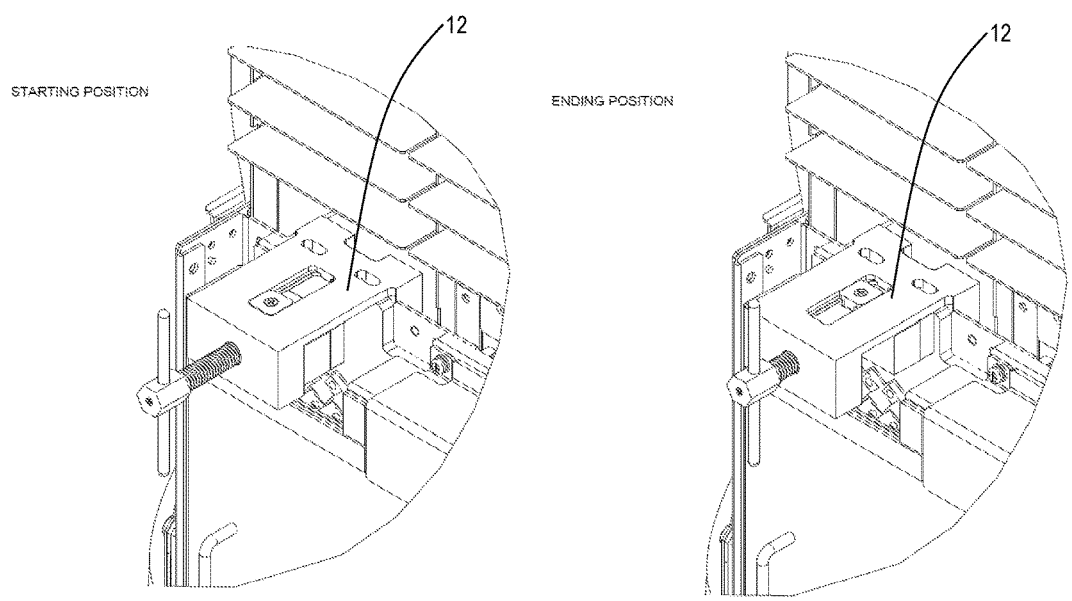
Figure 27:
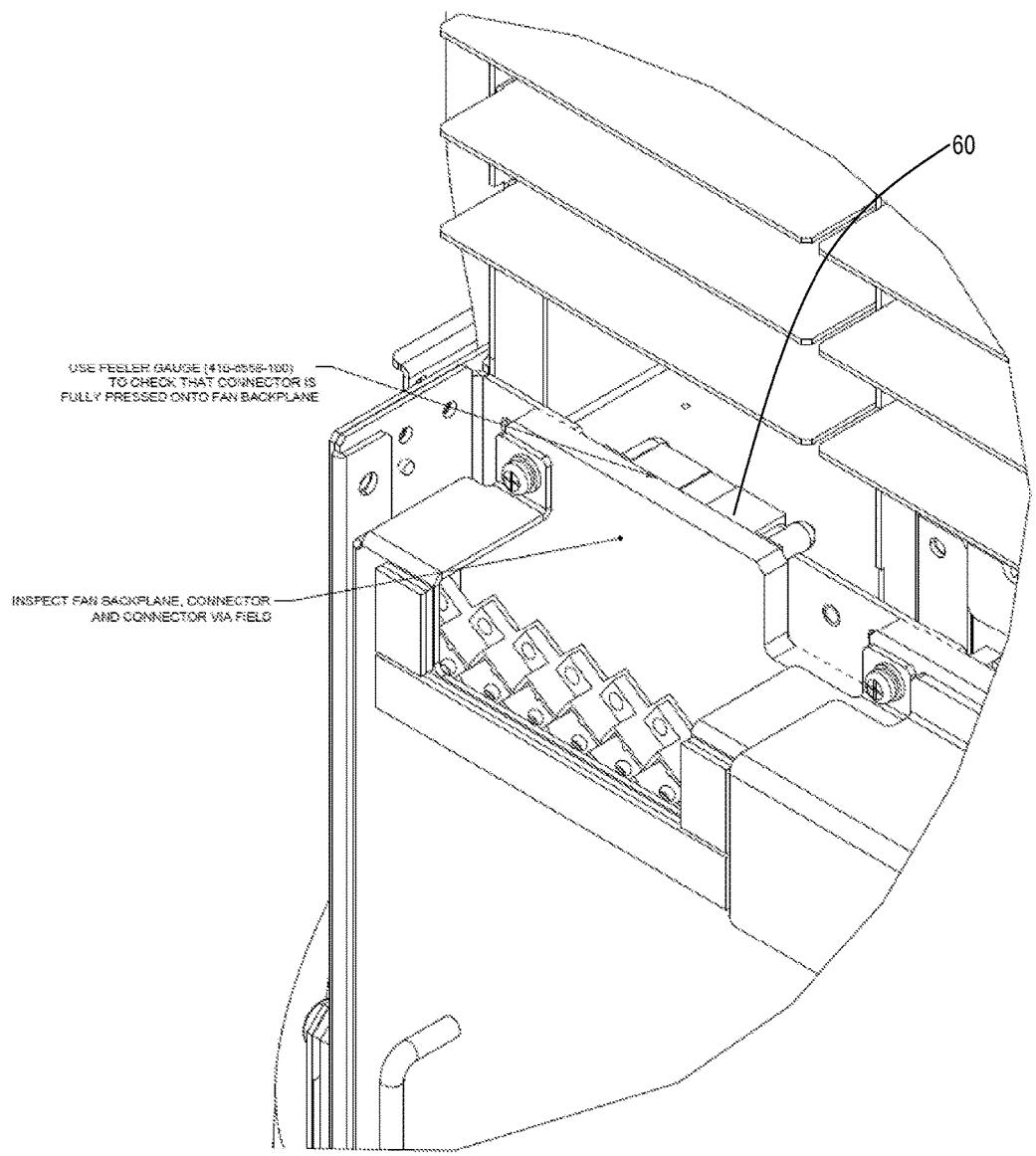
Figure 28:
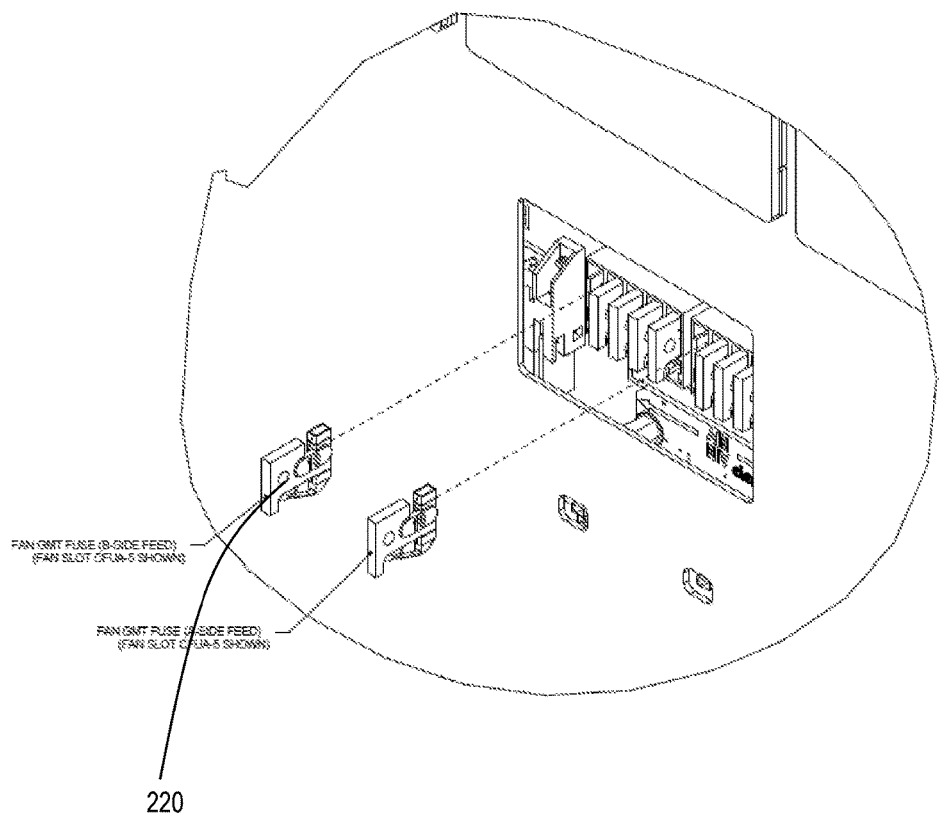
Figure 29:
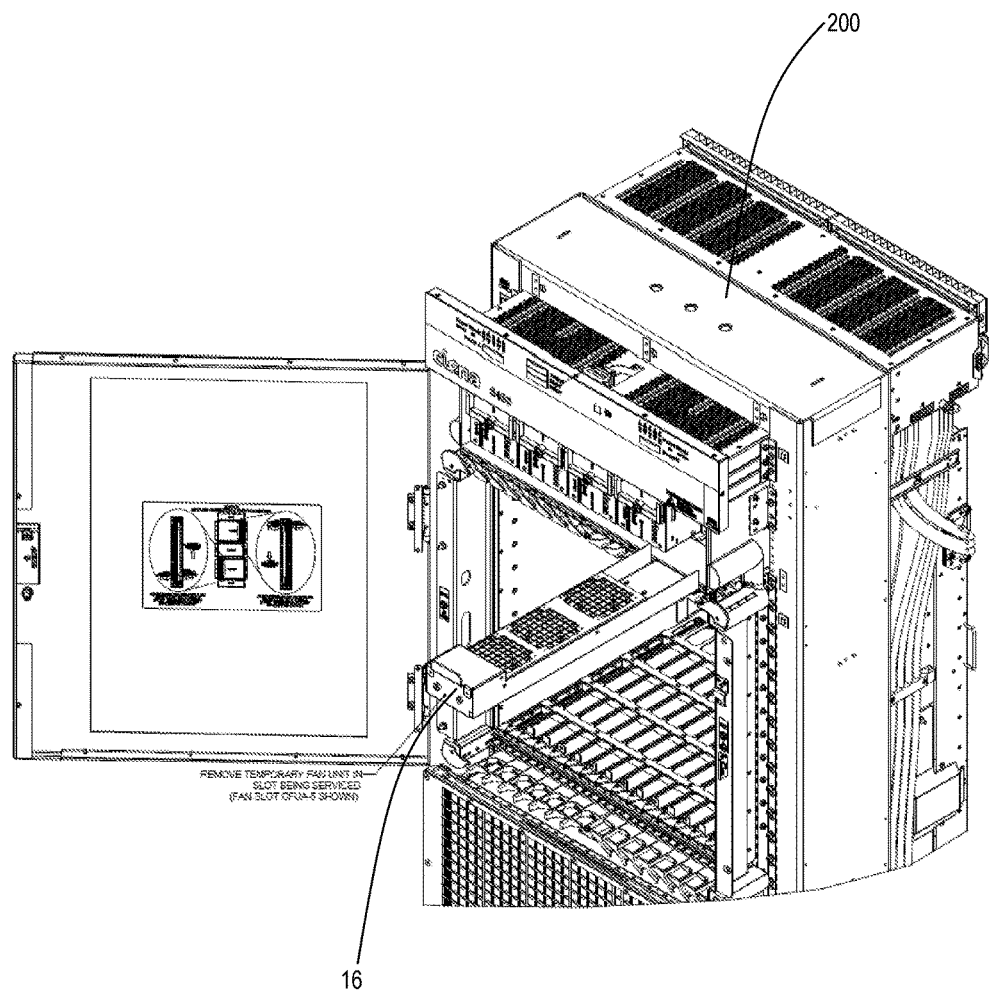
Figure 30:
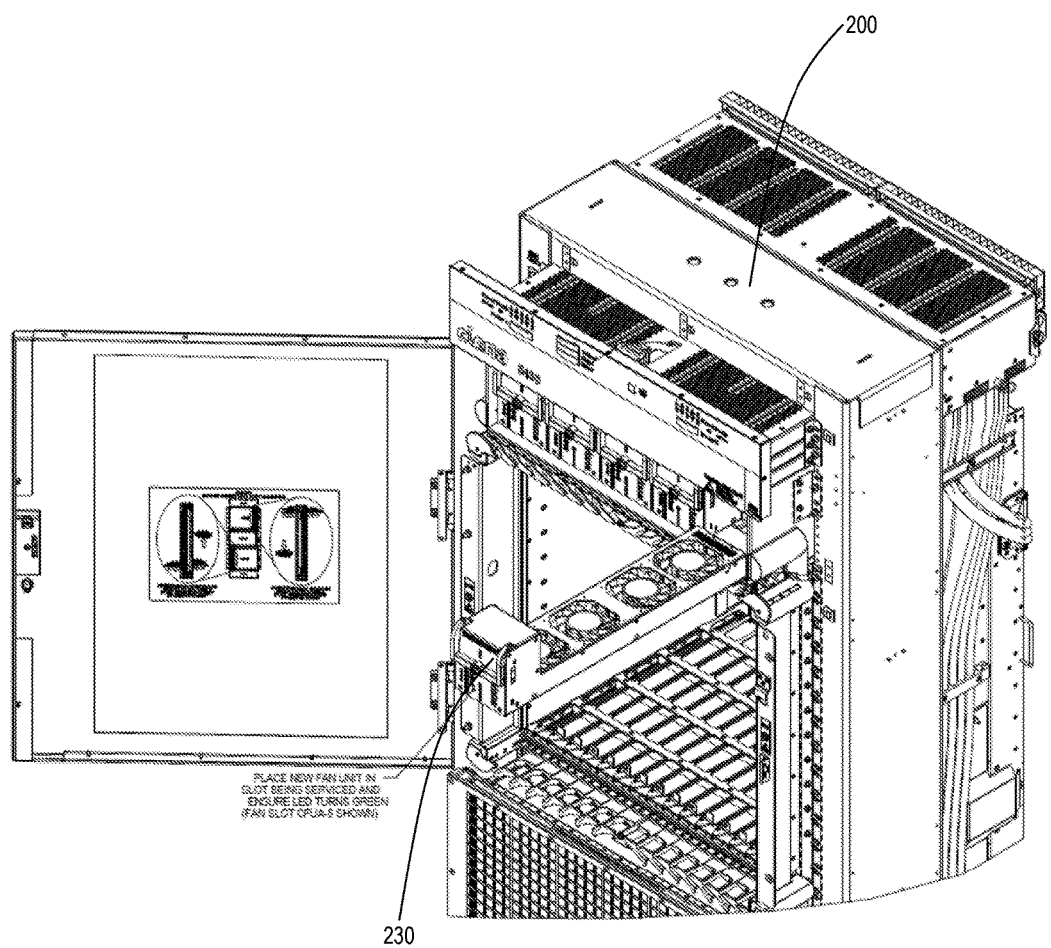
Figure 31:
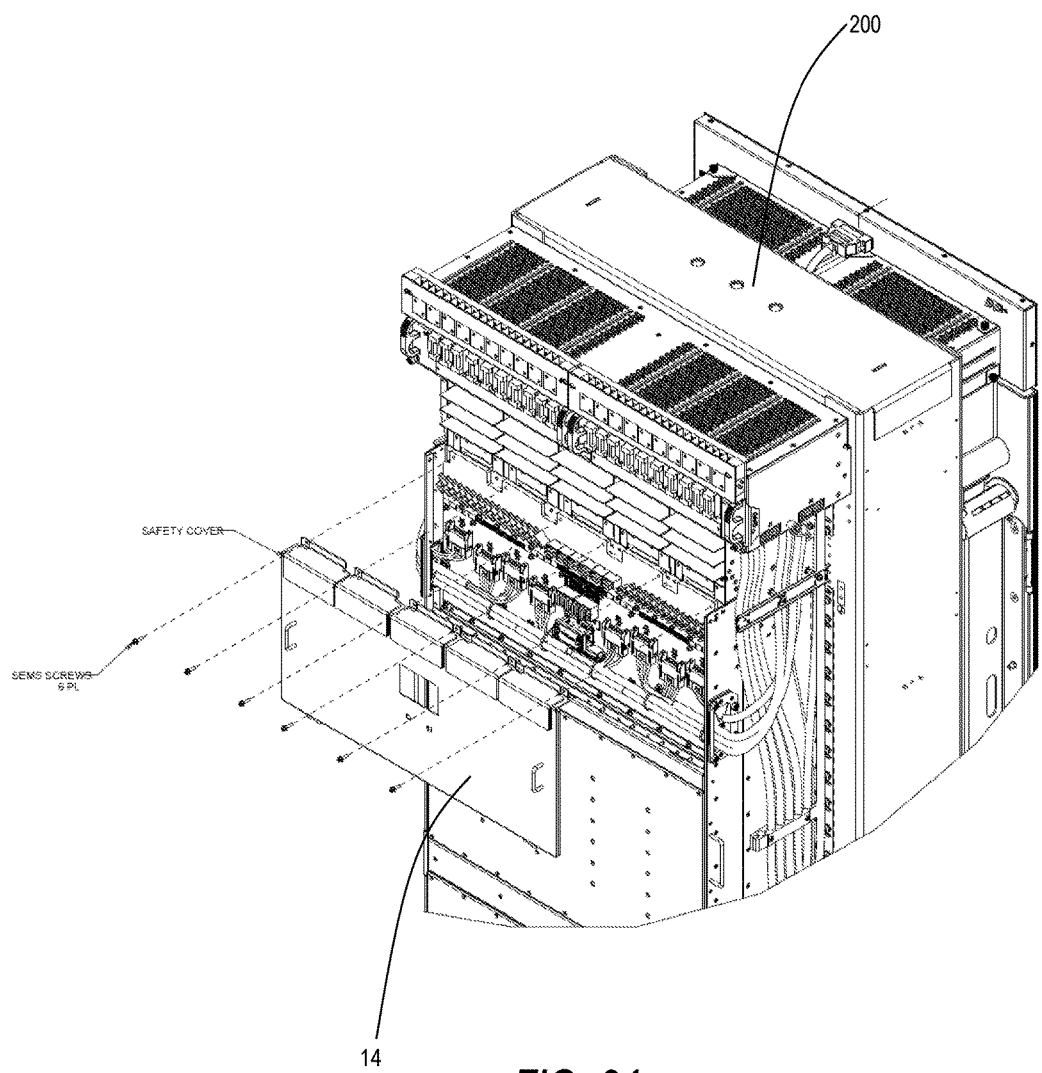

FIG. 26 illustrates step 107, inserting the new backplane fan unit connector using the connector insertion tool 12. FIG. 27 illustrates the new backplane connector block 60 installed. FIG. 28 illustrates step 108, powering the new backplane fan unit connector, by reinstalling the fuses 220. FIGS. 29 and 30 illustrate step 109, removing the temporary fan unit 16 (FIG. 29) and replacing with a fan unit 230 (FIG. 30). Finally, FIG. 31 illustrates step 110, removing the backplane safety cover 14, as well as replacing all of the components in FIGS. 14-18.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A connector replacement method in a network element chassis utilizing associated tools, the connector replacement method comprising:

obtaining a connector insertion tool comprising a housing, a handle, a vise configured to move based on rotation of the handle, a push out block configured to move based on movement of the vise, and a plurality of pins on the push out block arranged based on backplane connectors for replacement and configured to push out the backplane connectors for replacement based on movement of the push out block;

obtaining a connector removal tool comprising a housing, a handle, a vise configured to move based on rotation of the handle, a push in block configured to move based on movement of the vise, and a connector block on the housing opposing the push in block;

at a location where the network element chassis is physically deployed and operating in-service, obtaining physical access to a backplane in the network element chassis;

powering down backplane connectors for replacement while other backplane connectors remained powered;

removing the powered down backplane connectors with the connector removal tool;

inserting a new set of backplane connectors in place of the removed, powered down backplane connectors with the connector insertion tool; and powering up the new set of backplane connectors.

2. The connector replacement method of claim 1, further comprising:

installing a backplane safety cover over the physical access for protection of the backplane and the other backplane connectors during operation on the backplane connectors for replacement.

3. The connector replacement method of claim 2, wherein the backplane safety cover comprises an open portion for selective access to the backplane and one or more doors for selective access to the backplane connectors.

4. The connector replacement method of claim 1, wherein the backplane connectors for replacement comprise fan connectors, and the method further comprising:

installing an externally powered temporary fan unit subsequent to powering down the backplane connectors for replacement, enabling cooling during the method while the network element chassis is in-service.

5. The connector replacement method of claim 4, wherein the backplane connectors for replacement comprise fan connectors, and wherein temporary cooling is performed in the network element chassis while the backplane connectors for replacement are powered down.

6. A connector replacement method in a network element chassis utilizing associated tools, the connector replacement method comprising:

obtaining a connector insertion tool comprising a housing, a handle, a vise configured to move based on rotation of the handle, a push out block configured to move based on movement of the vise, and a plurality of pins on the push out block arranged based on backplane connectors for replacement and configured to push out the backplane connectors for replacement based on movement of the push out block;

obtaining a connector removal tool comprising a housing, a handle, a vise configured to move based on rotation of the handle, a push in block configured to move based on movement of the vise, and a connector block on the housing opposing the push in block;

at a location where the network element chassis is physically deployed and operating in-service, obtaining physical access to a backplane in the network element chassis;

powering down backplane connectors for replacement while other backplane connectors remained powered;
installing a backplane safety cover over the physical access for protection of the backplane and the other backplane connectors during operation on the backplane connectors for replacement;
removing the powered down backplane connectors with the connector removal tool;
inserting a new set of backplane connectors in place of the removed, powered down backplane connectors with the connector insertion tool; and
powering up the new set of backplane connectors.

7. The connector replacement method of claim 6, wherein the backplane safety cover comprises an open portion for selective access to the backplane and one or more doors for selective access to the backplane connectors.

8. The connector replacement method of claim 6, wherein the connector removal tool and the connector insertion tool are configured to operate on the powered down backplane connectors on one of a top portion of the backplane and a bottom portion of the backplane.

9. The connector replacement method of claim 6, wherein the backplane connectors for replacement comprise fan connectors, and the method further comprising:
installing an externally powered temporary fan unit subsequent to powering down the backplane connectors for replacement, enabling cooling during the method while the network element chassis is in-service.

10. The connector replacement method of claim 9, wherein the backplane connectors for replacement comprise fan connectors, and wherein temporary cooling is performed in the network element chassis while the backplane connectors for replacement are powered down.

11. A connector replacement method in a network element chassis utilizing associated tools, the connector replacement method comprising:
obtaining a connector insertion tool comprising a housing, a handle, a vise configured to move based on rotation of the handle, a push out block configured to move based on movement of the vise, and a plurality of pins on the push out block arranged based on backplane connectors for replacement and configured to push out the backplane connectors for replacement based on movement of the push out block;
obtaining a connector removal tool comprising a housing, a handle, a vise configured to move based on rotation of the handle, a push in block configured to move based on movement of the vise, and a connector block on the housing opposing the push in block;
at a location where the network element chassis is physically deployed and operating in-service, obtaining physical access to a backplane in the network element chassis;
powering down backplane connectors for replacement while other backplane connectors remained powered, wherein the backplane connectors for replacement comprise fan connectors;
installing an externally powered temporary fan unit subsequent to powering down the backplane connectors for replacement, enabling cooling during the method while the network element chassis is in-service;
removing the powered down backplane connectors with the connector removal tool;
inserting a new set of backplane connectors in place of the removed, powered down backplane connectors with the connector insertion tool; and
powering up the new set of backplane connectors.

12. The connector replacement method of claim 11, further comprising:
installing a backplane safety cover over the physical access for protection of the backplane and the other backplane connectors during operation on the backplane connectors for replacement.

13. The connector replacement method of claim 12, wherein the backplane safety cover comprises an open portion for selective access to the backplane and one or more doors for selective access to the backplane connectors.

14. The connector replacement method of claim 11, wherein the connector removal tool and the connector insertion tool are configured to operate on the powered down backplane connectors on one of a top portion of the backplane and a bottom portion of the backplane.

15. The connector replacement method of claim 11, wherein the backplane connectors for replacement comprise fan connectors, and wherein temporary cooling is performed in the network element chassis while the backplane connectors for replacement are powered down.

16. The connector replacement method of claim 1, wherein the connector removal tool and the connector insertion tool are configured to operate on the powered down backplane connectors on one of a top portion of the backplane and a bottom portion of the backplane.

* * * * *